US009991329B2

(12) United States Patent
Dirnecker et al.

(10) Patent No.: US 9,991,329 B2
(45) Date of Patent: Jun. 5, 2018

(54) METHOD AND STRUCTURE FOR DUAL SHEET RESISTANCE TRIMMABLE THIN FILM RESISTORS AT SAME LEVEL

(71) Applicant: Texas Instruments Incorporated, Dallas, TX (US)

(72) Inventors: Christoph Andreas Othmar Dirnecker, Eching (DE); Wolfgang Schwartz, Au (DE); Doug Weiser, Plano, TX (US); Joel Martin Halbert, Tucson, AZ (US); Joseph Anthony DeSantis, Gilroy, CA (US); Karsten Jens Spinger, Ingolstadt (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 7 days.

(21) Appl. No.: 15/209,696

(22) Filed: Jul. 13, 2016

(65) Prior Publication Data
US 2018/0019297 A1    Jan. 18, 2018

(51) Int. Cl.
H01L 49/02 (2006.01)
H01L 23/522 (2006.01)
H01L 23/528 (2006.01)
H01L 21/3205 (2006.01)
H01L 21/768 (2006.01)
H01L 21/3213 (2006.01)
H01L 21/027 (2006.01)
H01L 21/268 (2006.01)

(52) U.S. Cl.
CPC .......... *H01L 28/24* (2013.01); *H01L 21/0273* (2013.01); *H01L 21/268* (2013.01); *H01L 21/32051* (2013.01); *H01L 21/32139* (2013.01); *H01L 21/76802* (2013.01); *H01L 21/76877* (2013.01); *H01L 23/528* (2013.01); *H01L 23/5226* (2013.01); *H01L 23/5228* (2013.01)

(58) Field of Classification Search
None
See application file for complete search history.

(56) References Cited

U.S. PATENT DOCUMENTS

2007/0069299 A1\* 3/2007 Beach ............... H01L 21/76895
257/363

\* cited by examiner

*Primary Examiner* — Michelle Mandala
(74) *Attorney, Agent, or Firm* — Andrew R. Ralston; Charles A. Brill; Frank D. Cimino

(57) ABSTRACT

An integrated circuit includes a higher sheet resistance resistor and a lower sheet resistance resistor, disposed in a same level of dielectric layers of the integrated circuit. The higher sheet resistor has a body region and head regions in a higher sheet resistance layer. The lower sheet resistor has a body region and head regions in a lower sheet resistance layer, which is thicker than the higher sheet layer. The higher sheet resistor has an upper head layer contacting the higher sheet layer at each head region of the higher sheet layer. Each upper head layer has a same composition and thickness as the lower sheet layer of the lower sheet resistor. The lower sheet resistor is free of head layers over the lower sheet resistance layer.

12 Claims, 21 Drawing Sheets

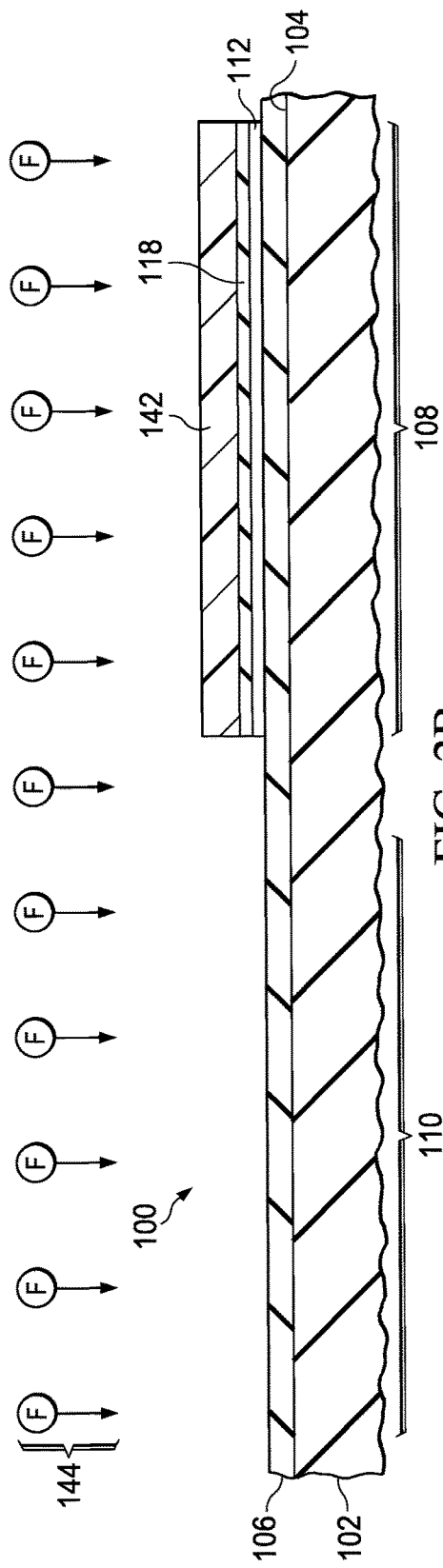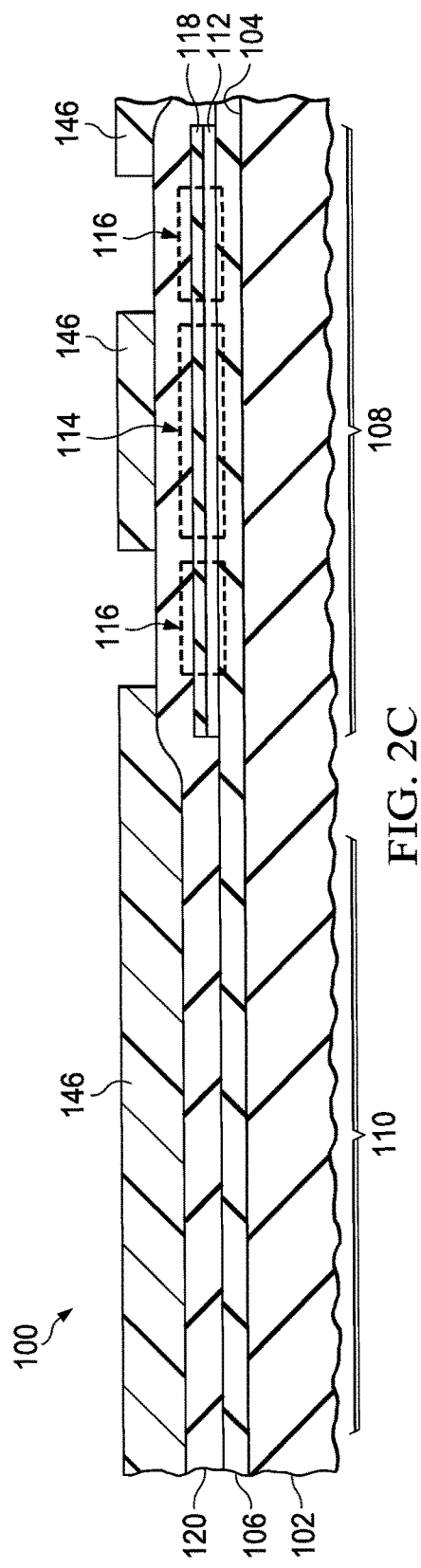

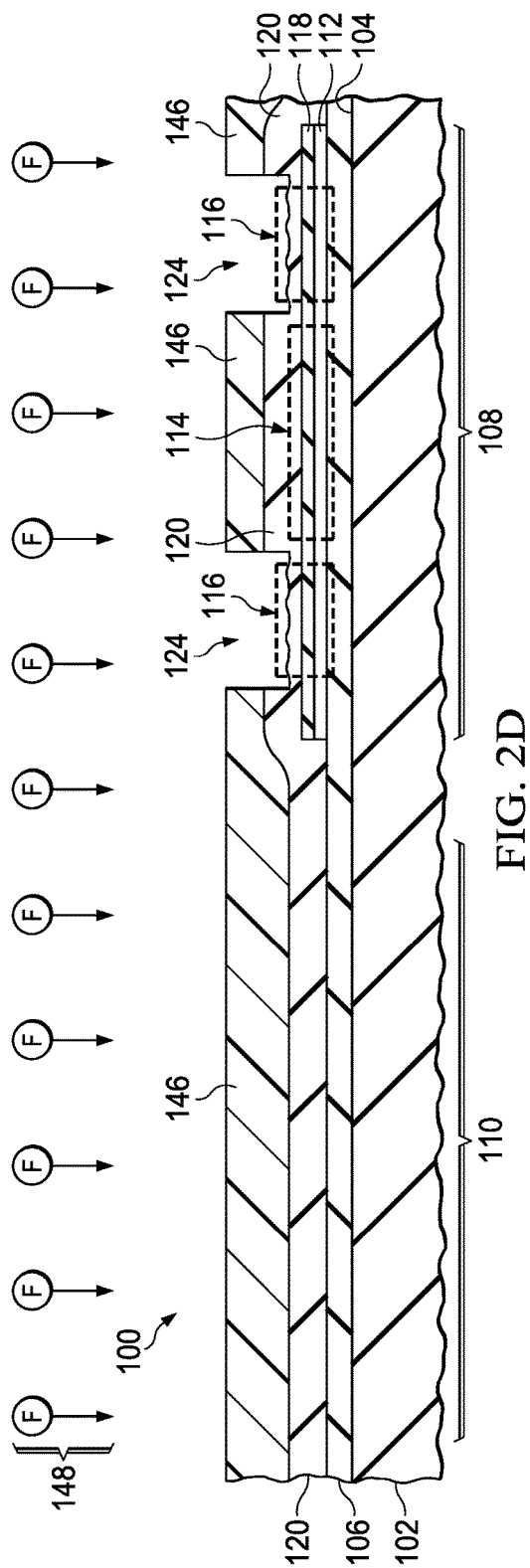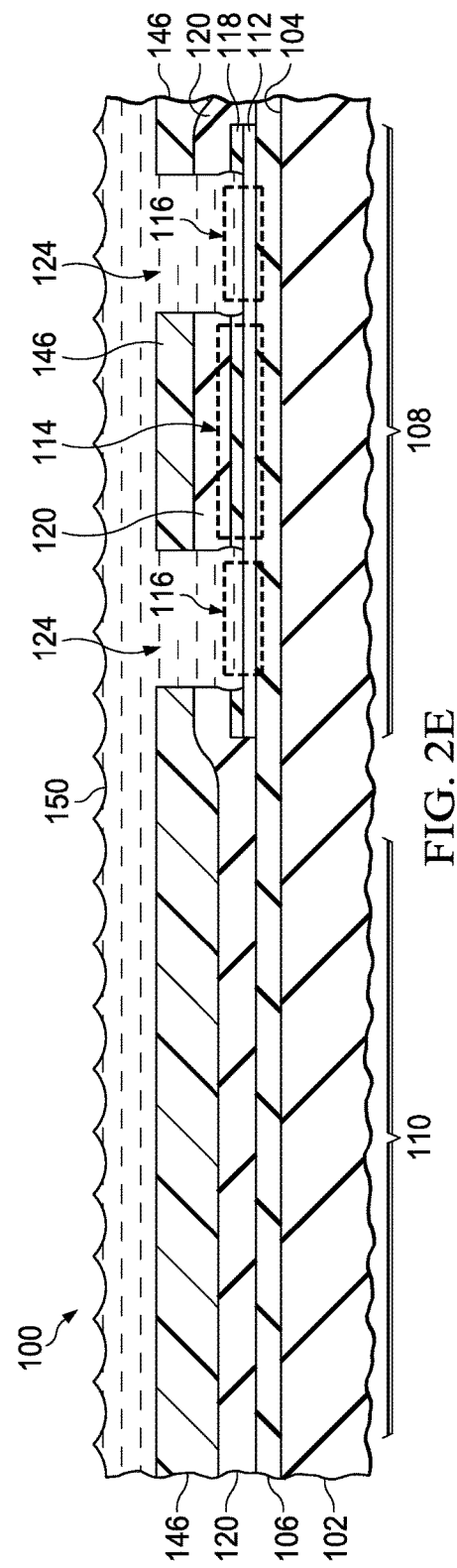

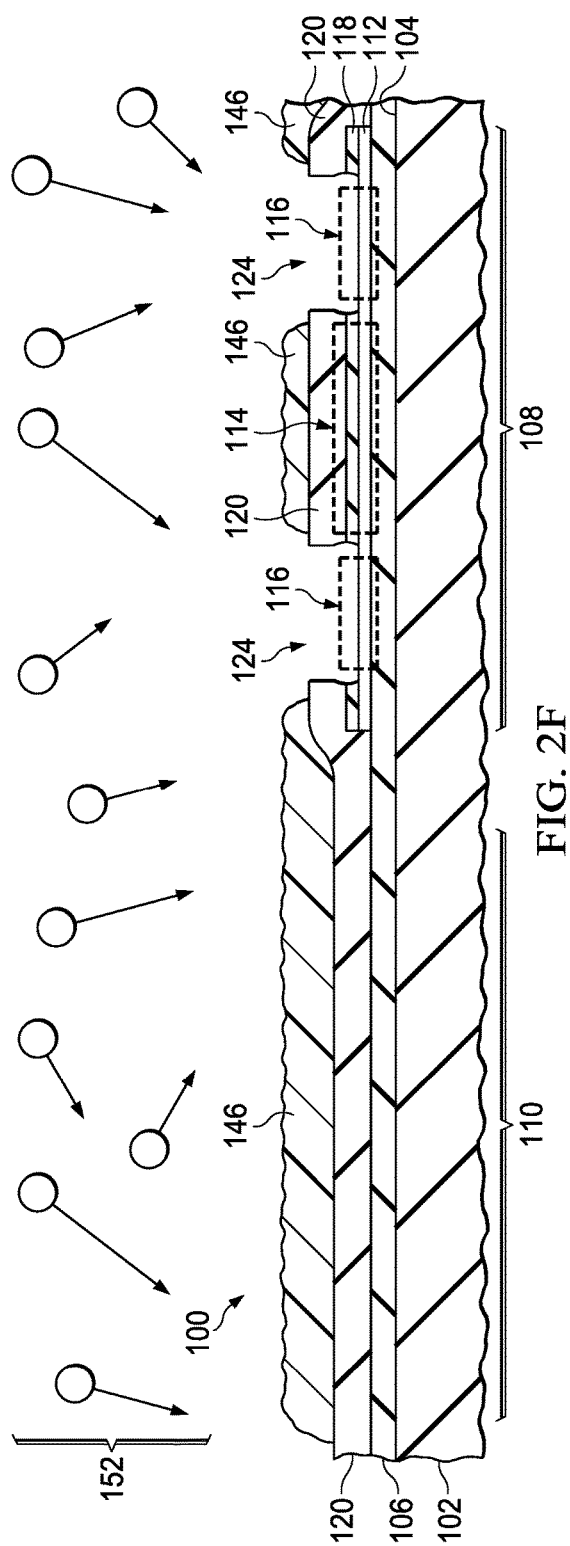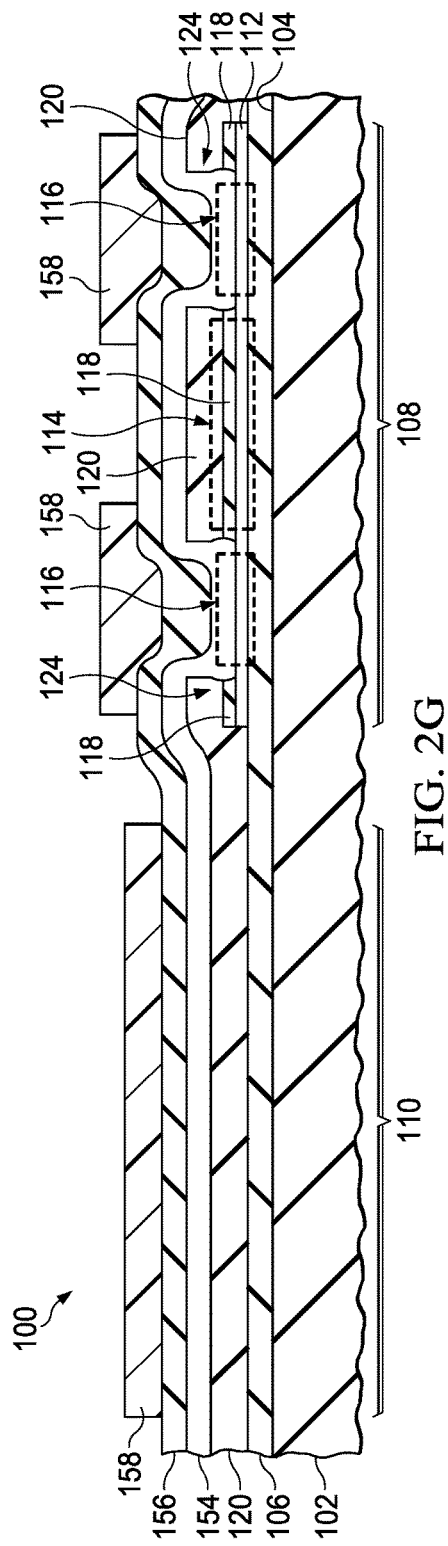

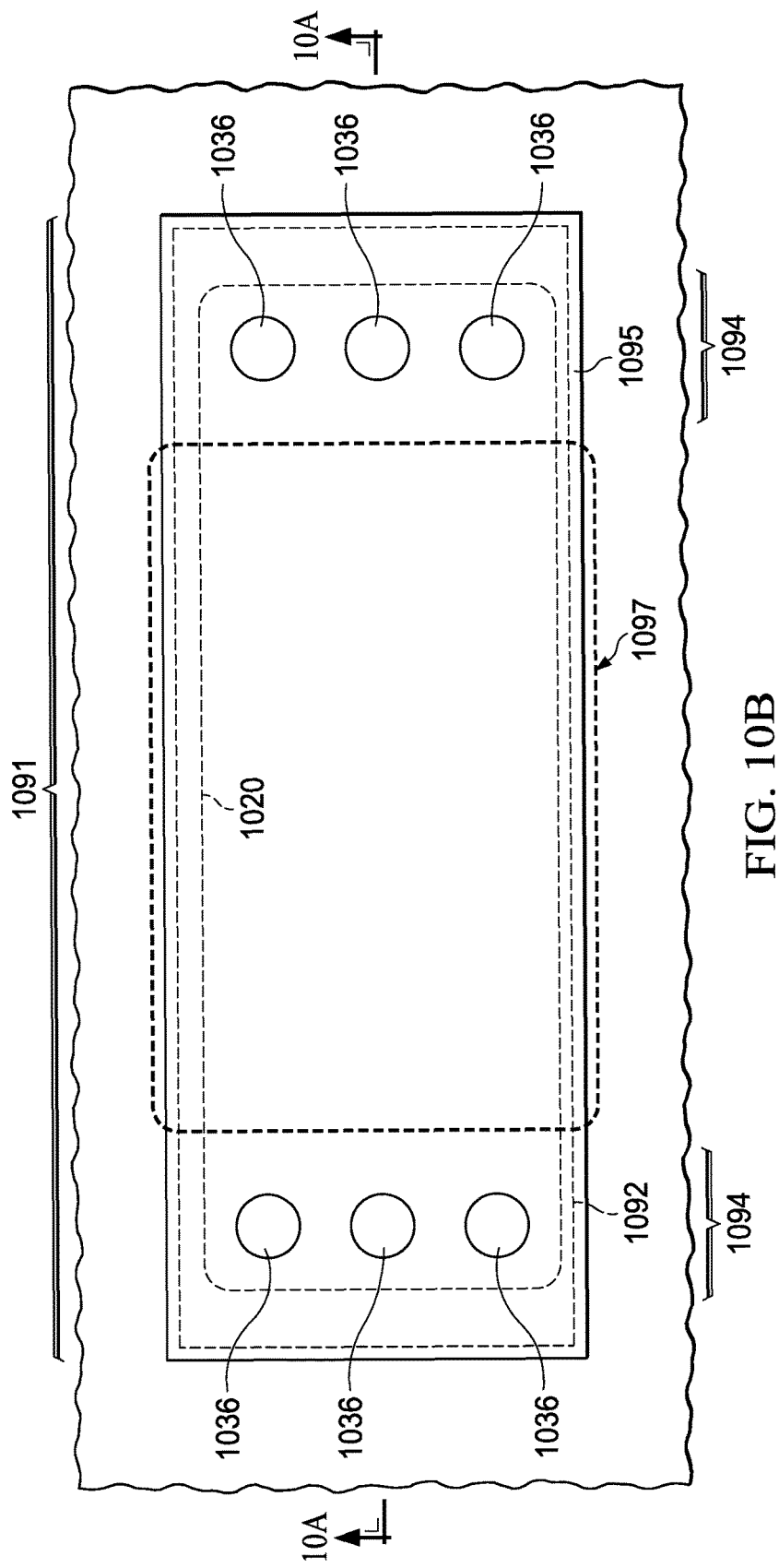

METHOD AND STRUCTURE FOR DUAL SHEET RESISTANCE TRIMMABLE THIN FILM RESISTORS AT SAME LEVEL

FIELD OF THE INVENTION

This invention relates to the field of integrated circuits. More particularly, this invention relates to laser-trimmable resistors in integrated circuits.

BACKGROUND OF THE INVENTION

Some integrated circuits require a laser-trimmable high-ohm resistor with a high resistance, having a sheet resistance for example above 300 ohms/square, and another laser-trimmable low-ohm resistor with a lower resistance, having a sheet resistance for example below 200 ohms/square. The high-ohm resistor is most suitable for low-power circuitry and may be used for feedback networks and bias resistors of several thousand or more ohms in amplifiers; the higher sheet resistance reduces the area of the high-ohm resistor. The low-ohm resistor is most suitable for high current circuitry, and may be used for current sensing, high speed networks or impedance termination requiring tens of ohms to a few hundred ohms; the lower sheet resistance provides sufficient area for laser trimming. Laser trimmability is facilitated when both the higher sheet resistor and the lower sheet resistor are disposed at the same level in the interconnect layer stack of the integrated circuit. This is because effective laser trimming requires focusing the laser on the resistor bodies. Having the resistors at different levels in the interconnect layer stack would require additional focus steps, increasing the time and cost of the laser trimming. The high-ohm resistor requires heads with lower sheet resistance, and so forming both the high-ohm resistor and the low-ohm resistor has required four photolithographic operations to form the bodies of the two resistors and the heads of the higher sheet resistor, with the attendant fabrication costs.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes a higher sheet resistance resistor, referred to herein as the higher sheet resistor, and a lower sheet resistance resistor, referred to herein as the lower sheet resistor, disposed in a same level of dielectric layers of the integrated circuit. The higher sheet resistor has a body region and head regions in a higher sheet resistance layer, referred to herein as the higher sheet layer, which is laser-trimmable. The lower sheet resistor has a body region and head regions in a lower sheet resistance layer, referred to herein as the lower sheet layer, which is also laser-trimmable, is thicker than the higher sheet layer, and has a sheet resistance lower than the higher sheet layer. The higher sheet resistor has an upper head layer contacting the higher sheet layer at each head region of the higher sheet layer. Each upper head layer has a same composition and thickness as the lower sheet layer of the lower sheet resistor. The higher sheet resistor is free of additional head layers over the upper head layers. The lower sheet resistor is free of head layers over the lower sheet layer. The higher sheet layer has a higher sheet resistance than the lower sheet layer.

The higher sheet resistor and the lower sheet resistor are formed by forming a layer of higher sheet resistance material over a lower dielectric layer of the integrated circuit, and patterning the higher sheet layer to form the higher sheet layer of the higher sheet resistor. An intermediate dielectric layer is formed over the higher sheet layer, an intermediate via mask is formed over the intermediate dielectric layer, and intermediate via holes are etched through the intermediate dielectric layer to the head regions of the higher sheet layer. A layer of lower sheet resistance material is formed over the intermediate dielectric layer, extending into the intermediate via holes and contacting the higher sheet layer in the head regions. A lower sheet mask is formed over the layer of lower sheet resistance material, and the layer of lower sheet resistance material is etched to form the upper head layers of the higher sheet resistor and to form the lower sheet layer of the lower sheet resistor.

DESCRIPTION OF THE VIEWS OF THE DRAWING

FIG. 10A and FIG. 10B depict an example integrated circuit containing another laser-trimmable composite resistor.

DETAILED DESCRIPTION OF EXAMPLE EMBODIMENTS

Figure 1:
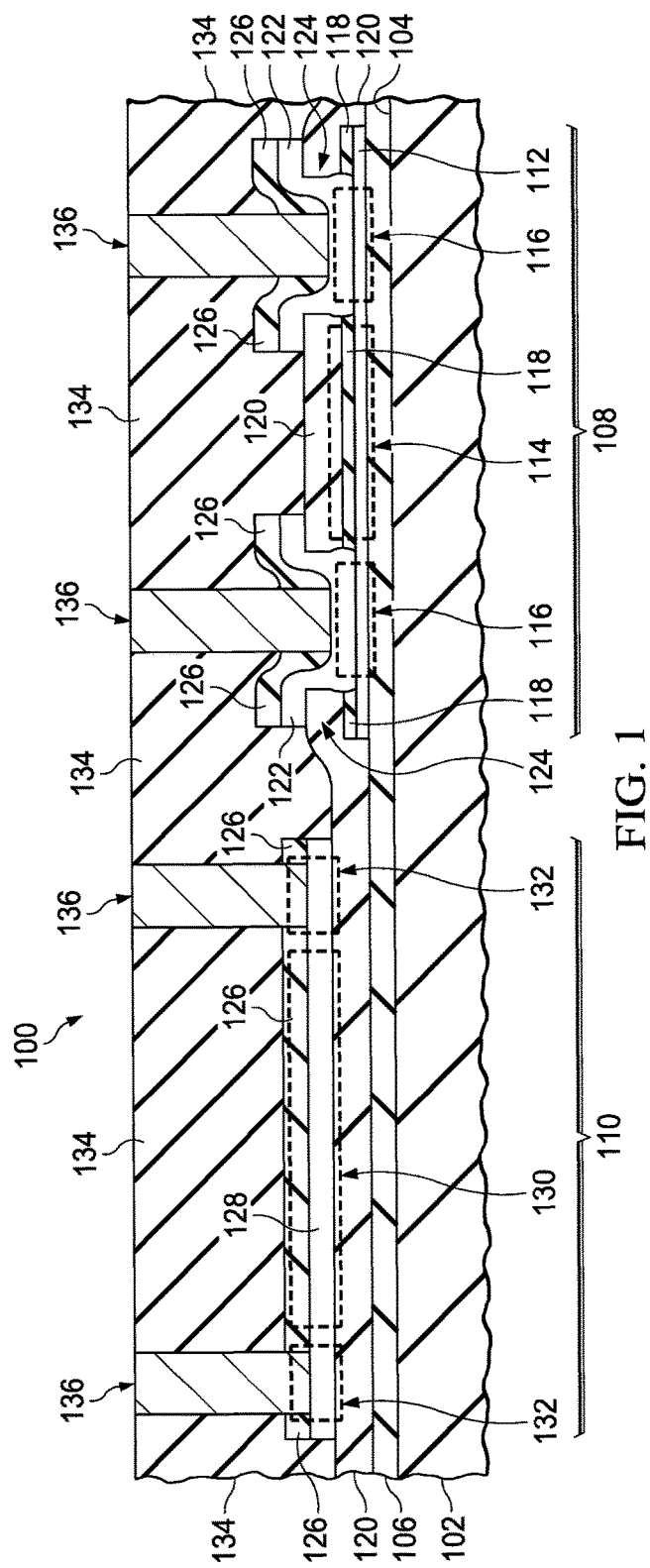
FIG. 1 is a cross section of an example integrated circuit which includes a higher sheet resistor and a lower sheet resistor.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit includes a higher sheet resistance resistor, referred to herein as the higher sheet resistor, and a lower sheet resistance resistor, referred to herein as the lower sheet resistor, disposed in a same level of dielectric layers of the integrated circuit. For the purposes of this disclosure, the term "disposed in a same level of dielectric layers" is understood to mean the higher sheet resistor and the lower sheet resistor are disposed over a lower dielectric layer and under a second dielectric layer, wherein there are no interconnect metal levels of the integrated circuit between the lower dielectric layer and the second dielectric layer. The higher sheet resistor has a body region and head regions in a higher sheet resistance layer, referred to herein as the higher sheet layer, which is laser-trimmable. The lower sheet resistor has a body region and head regions in a lower sheet resistance layer, referred to herein as the lower sheet layer, which is also laser-trimmable, is thicker than the higher sheet layer, and has a sheet resistance less than a sheet resistance of the higher sheet layer. Laser-trimmable is understood to mean that laser trim operations, as are known in the art, applied to the higher sheet resistor and the lower sheet resistor will modify resistances of the higher sheet resistor and the lower sheet resistor. For example, the higher sheet layer may have a thickness of 1 nanometer to 30 nanometers and a sheet resistance greater than 200 ohms/square, and the lower sheet layer may have a thickness of 20 nanometers to 300 nanometers and greater than the thickness of the higher sheet layer, and a sheet resistance of 10 ohms/square to 200 ohms/square. The higher sheet resistor has an upper head layer contacting the higher sheet layer at each head region of the higher sheet layer. The lower sheet resistor is free of head layers over the lower sheet layer. The higher sheet resistor is free of head layers over the upper head layers. It is understood that interconnection elements such as vias or interconnects which contact the higher sheet resistor and the lower sheet resistor do not provide head layers to the higher sheet resistor and the lower sheet resistor. Each upper head layer has a same composition and thickness as the lower sheet layer of the lower sheet resistor. Electrical connections to the higher sheet resistor may be made to the upper head layers. Electrical connections to the lower sheet resistor may be made to the head regions of the lower sheet layer.

The higher sheet resistor and the lower sheet resistor are formed by forming a layer of higher sheet resistance material over a lower dielectric layer of the integrated circuit, and patterning the higher sheet layer to form the higher sheet layer of the higher sheet resistor. An intermediate dielectric layer is formed over the higher sheet layer, an intermediate via mask is formed over the intermediate dielectric layer, and intermediate via holes are etched through the intermediate dielectric layer to the head regions of the higher sheet layer. A layer of lower sheet resistance material is formed over the intermediate dielectric layer, extending into the intermediate via holes and contacting the higher sheet layer in the head regions. A lower sheet mask is formed over the layer of lower sheet resistance material, and the layer of lower sheet resistance material is etched to form the upper head layers of the higher sheet resistor and to form the lower sheet layer of the lower sheet resistor.

For the purposes of this disclosure, chemical names and elemental formulas of materials do not imply a particular stoichiometry of the elements. For example, the term silicon dioxide may refer to a material containing silicon and oxygen having an atomic ratio different from 1:2. Similarly, the term silicon nitride may refer to a material containing silicon and nitrogen having an atomic ratio different from 3:4. In another example, the term silicon chromium may refer to a material with any atomic ratio of silicon to chromium, and the term carbon-doped silicon chromium may refer to a material with various atomic fractions of silicon, chromium and carbon. In a further example, an elemental formula such as $Si_xO_yN_z$ may refer to a material with various atomic fractions of silicon, oxygen and nitrogen.

FIG. 1 is a cross section of an example integrated circuit which includes a higher sheet resistor and a lower sheet resistor. The integrated circuit 100 includes a lower dielectric layer 102 which may be, for example, a layer of silicon dioxide on an active area of the integrated circuit 100, a layer of field oxide over a substrate of the integrated circuit 100, an intra-metal dielectric (IMD) layer in an interconnect layer stack of the integrated circuit 100, or an inter-level dielectric (ILD) layer in the interconnect layer stack of the integrated circuit 100. The lower dielectric layer 102 may include silicon dioxide or silicon dioxide-based dielectric material at a top surface 104. The lower dielectric layer 102 may have been planarized by an oxide chemical mechanical polish (CMP) process so that its top surface 104 is substantially flat. An optional nucleation dielectric layer 106 may possibly be disposed on the top surface 104 of the lower dielectric layer 102. The nucleation dielectric layer 106 may include, for example, 10 nanometers to 50 nanometers of silicon dioxide. The integrated circuit 100 includes a higher sheet resistor 108 and a lower sheet resistor 110. Silicon dioxide in the nucleation dielectric layer 106 may provide low stress to a body region of the higher sheet resistor 108, which may advantageously provide more consistent properties for the higher sheet resistor 108 compared to other nucleation dielectric materials.

The higher sheet resistor 108 has a higher sheet resistance layer 112, referred to herein as the higher sheet layer 112, which extends through a body region 114 and through head regions 116; the body region 114 is located at ends of the head regions 116. The higher sheet layer 112 is laser-trimmable. For example, the higher sheet layer 112 may comprise 1 nanometer to 30 nanometers of conductive material, and may have a sheet resistance greater than 200 ohms/square. The higher sheet layer 112 may include thin film resistor materials such as, nickel chromium, nickel chromium aluminum, silicon chromium, carbon-doped silicon chromium, silicon chromium aluminum, tantalum nitride, titanium nitride, silicon, germanium, and/or ceramic metal commonly referred to as cermet, Other materials in the higher sheet layer 112 are within the scope of the instant example. Atomic fractions of the various elements in the higher sheet layer 112 may be selected and processed to provide a desired sheet resistance and a desired temperature coefficient of resistance (TCR). The nucleation dielectric layer 106, if present, may provide a top surface with a uniform stoichiometry and chemical potential which may advantageously provide consistent and uniform stoichiometry, and hence consistent and uniform electrical properties, for the higher sheet layer 112. The higher sheet resistor 108 may possibly include an optional protective dielectric layer 118 disposed over, and coterminous with, the higher sheet layer 112. The protective dielectric layer 118 may be, for example, 2 nanometers to 6 nanometers of silicon dioxide. Silicon dioxide in the protective dielectric layer 118 may provide low stress to the higher sheet layer 112, which may advantageously provide more consistent properties for the higher sheet resistor 108 compared to other protective dielectric materials. An intermediate dielectric layer 120 is disposed over the body region 114, on the protective dielectric layer 118 if present, or on the higher sheet layer 112 if the protective dielectric layer 118 is not present. The intermediate dielectric layer 120 may include, for example, 60 nanometers to 120 nanometers of silicon dioxide. Upper head layers 122, are disposed on the higher sheet layer 112 in the head regions 116, extending through intermediate via holes 124 in the intermediate dielectric layer 120 and the protective dielectric layer 118. A stoichiometry of the intermediate dielectric layer 120 may be substantially equal to a stoichiometry of the protective dielectric layer 118, which may advantageously provide a desired profile of the intermediate via holes 124 with reduced undercut. The upper head layers 122 are thicker than the higher sheet layer 112, with sheet resistances lower than the higher sheet layer 112. The upper head layers 122 may include one or more sub-layers of the materials described in reference to the higher sheet layer 112, and may have a similar composition to the higher sheet layer 112. A hard mask 126 may be disposed over the upper head layers 122. The hard mask 126 may include 60 nanometers to 120 nanometers of dielectric material, and may include one or more sub-layers of silicon dioxide, silicon nitride or other hard mask material.

The intermediate dielectric layer 120 extends throughout the area for the lower sheet resistor 110. The lower sheet resistor 110 has a lower sheet resistance layer 128, referred to herein as the lower sheet layer 128, which extends through a body region 130 and through head regions 132 adjacent to the body region 130. The lower sheet layer 128 is laser-trimmable, and has a same thickness and composition as the upper head layers 122 of the higher sheet resistor 108. For example, the lower sheet layer 128 may have a thickness of 20 nanometers to 300 nanometers, wherein the thickness of the lower sheet layer 128 is more than the thickness of the higher sheet layer 112. The lower sheet layer 128 may have a sheet resistance of 10 ohms/square to 200 ohms/square. The hard mask 126, if present over the upper head layers 122 is also disposed over the lower sheet layer 128. Silicon dioxide in the hard mask 126 may provide low stress to the lower sheet layer 128, which may advantageously provide more consistent properties for the lower sheet resistor 110 compared to other hard mask materials.

An ILD layer 134 is disposed over the higher sheet resistor 108 and the lower sheet resistor 110. The ILD layer 134 may be, for example, 200 nanometers to 2 microns thick, and may include a main dielectric layer comprising one or more sub-layers of silicon dioxide, phosphorus silicon glass (PSG), boron phosphorus silicon glass (BPSG), organic silicon glass (OSG), low-k dielectric material, and/or spin-on glass (SOG). The ILD layer 134 may optionally include an etch stop layer of silicon with nitrogen, oxygen and/or carbon. The ILD layer 134 may be planarized to provide a flat surface for additional interconnect levels of the integrated circuit 100. Vias 136 are disposed through the ILD layer 134 and make electrical contact to the higher sheet resistor 108 and the lower sheet resistor 110. In the instant example, at least one of the vias 136 extends through the hard mask 126 and contacts each of the upper head layers 122 to provide electrical connections to the higher sheet resistor 108. The higher sheet resistor 108 is free of additional head layers between the vias 136 and the upper head layers 122. At least one of the vias 136 extends through the hard mask 126 and contacts the lower sheet layer 128 in each of the head regions 132 to provide electrical connections to the lower sheet resistor 110. The lower sheet resistor 110 is free of head layers between the vias 136 and the lower sheet layer 128. In the instant example, other instances of the vias 136 may contact interconnect metal that may or may not be associated with the higher sheet resistor 108 or the lower sheet resistor 110. The higher sheet resistor 108 and the lower sheet resistor 110 are advantageously both laser-trimmable with a same laser set up, due to the low thickness of the higher sheet layer 112 and the lower sheet layer 128, and due to being disposed in a same dielectric level of the integrated circuit 100, that is being disposed above the lower dielectric layer 102 and below the ILD layer 134.

Figure 2A:
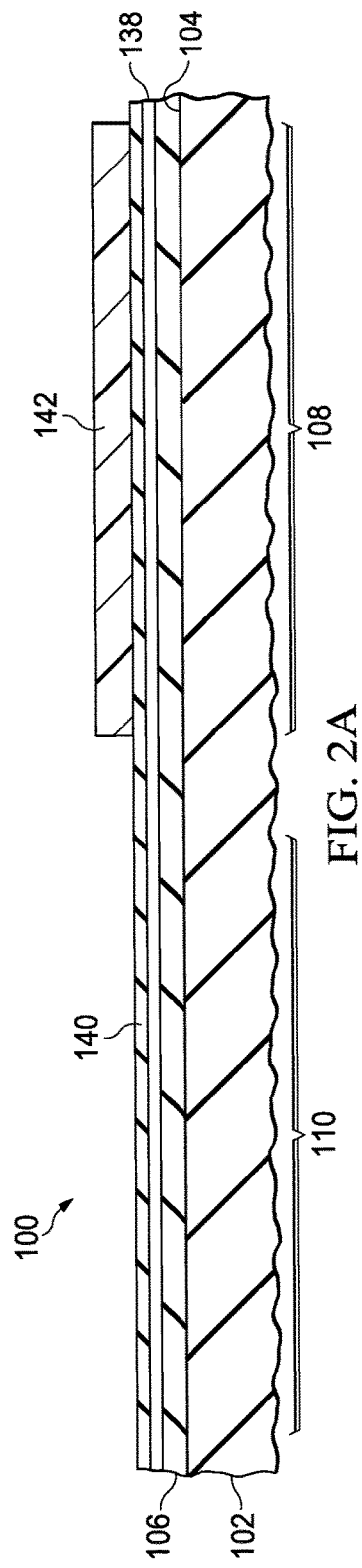
FIG. 2A through FIG. 2N are cross sections of the integrated circuit of FIG. 1, depicted in successive stages of an example method of formation.
Figure 2H:
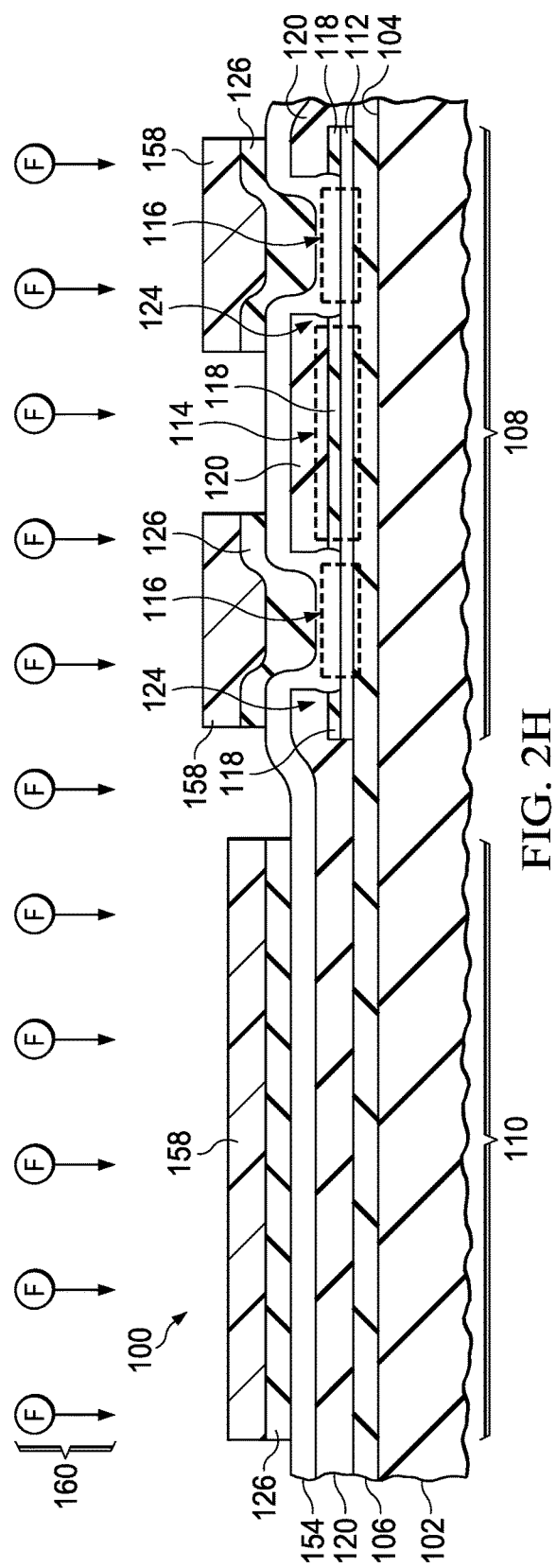
Figure 2I:
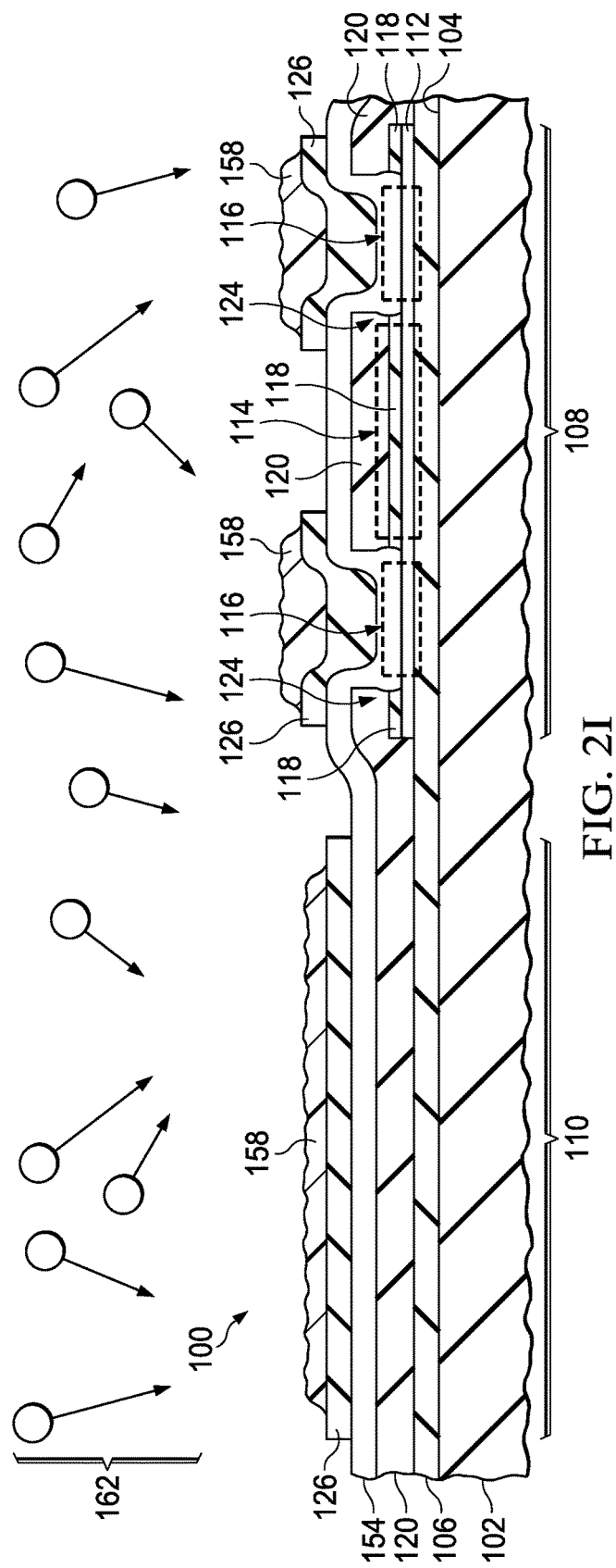
Figure 2J:
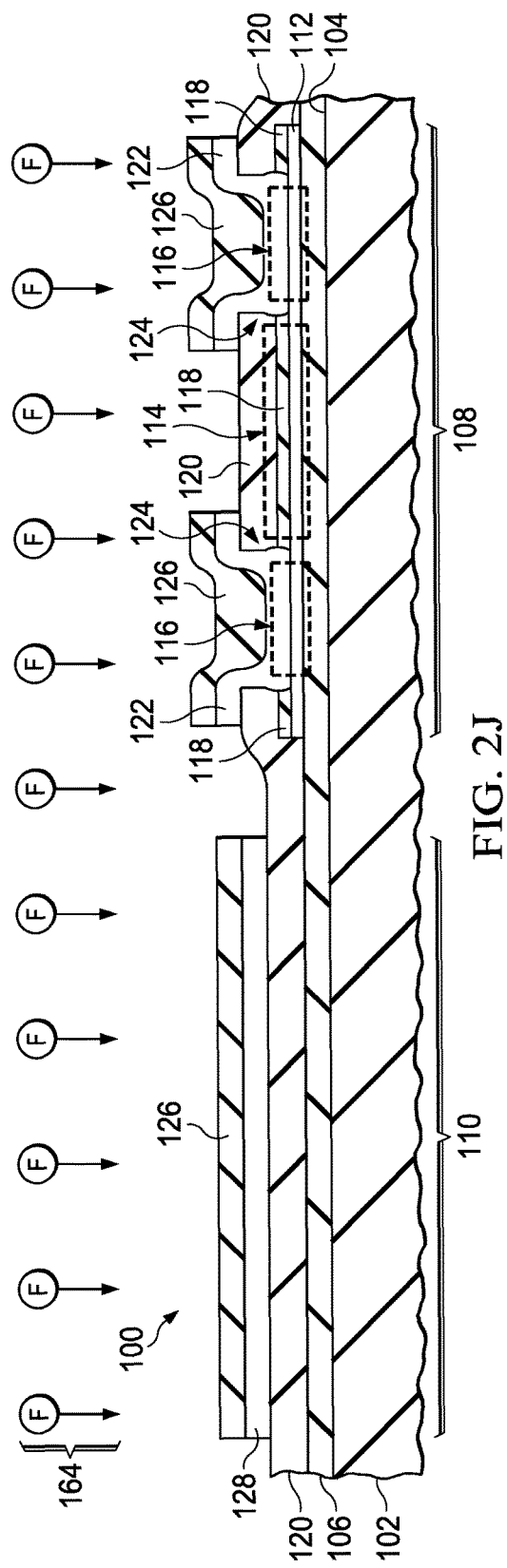
Figure 2K:
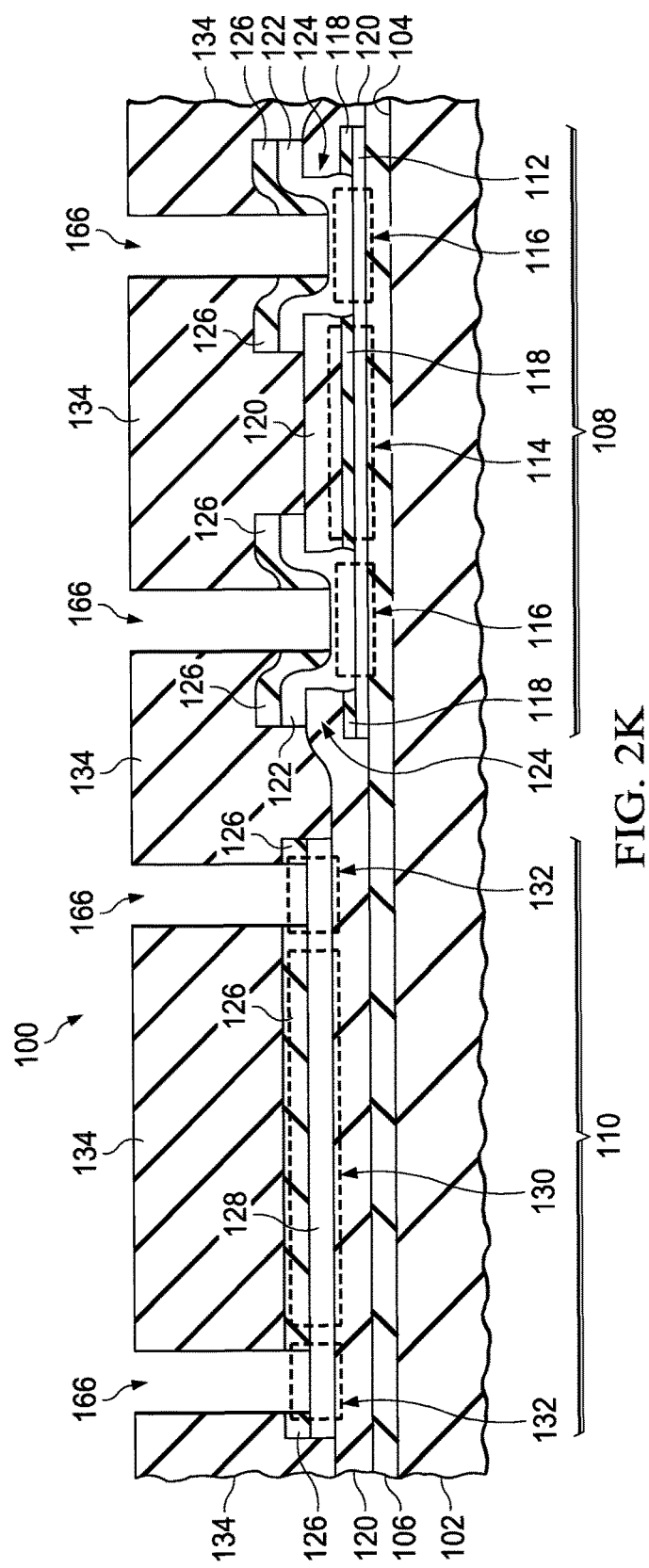
Figure 2L:
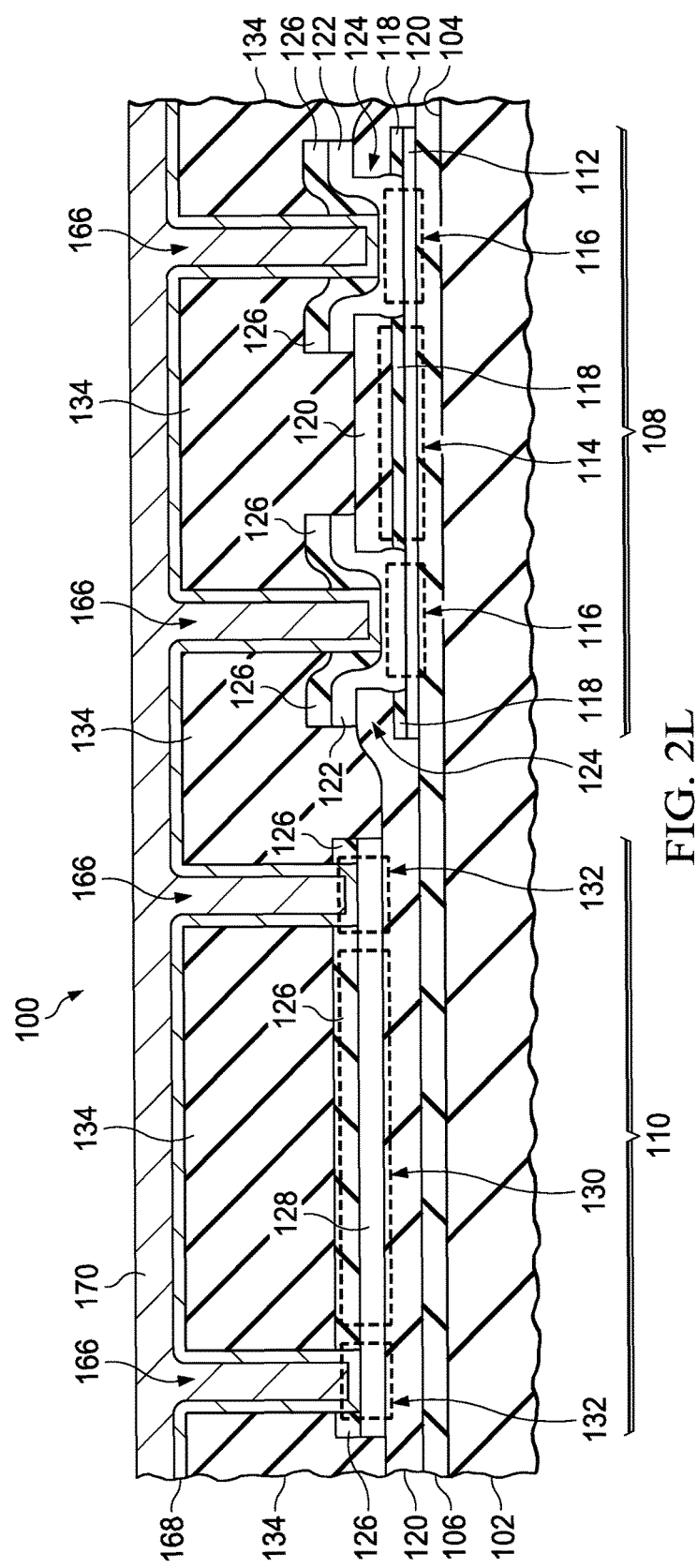
Figure 2M:
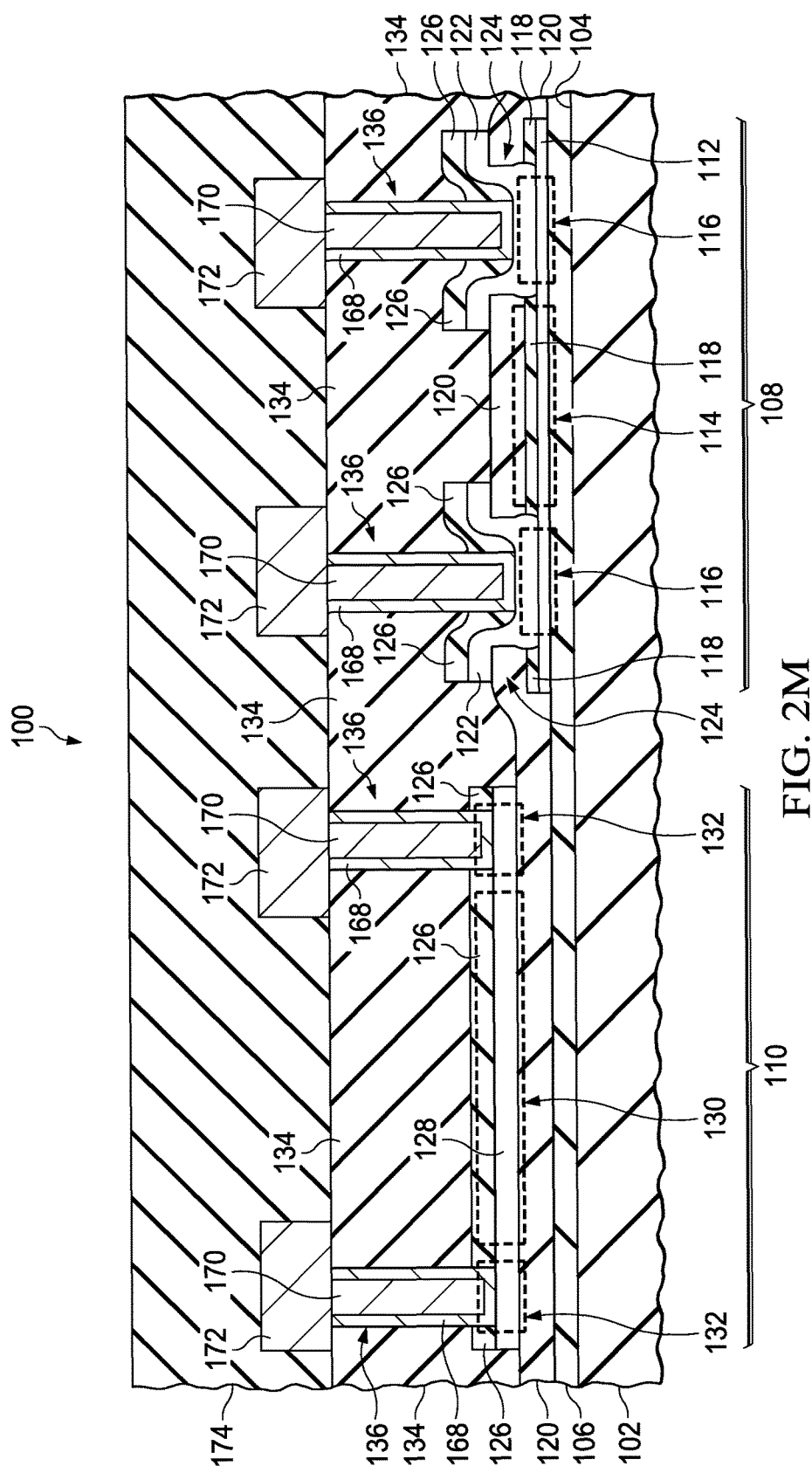
Figure 2N:
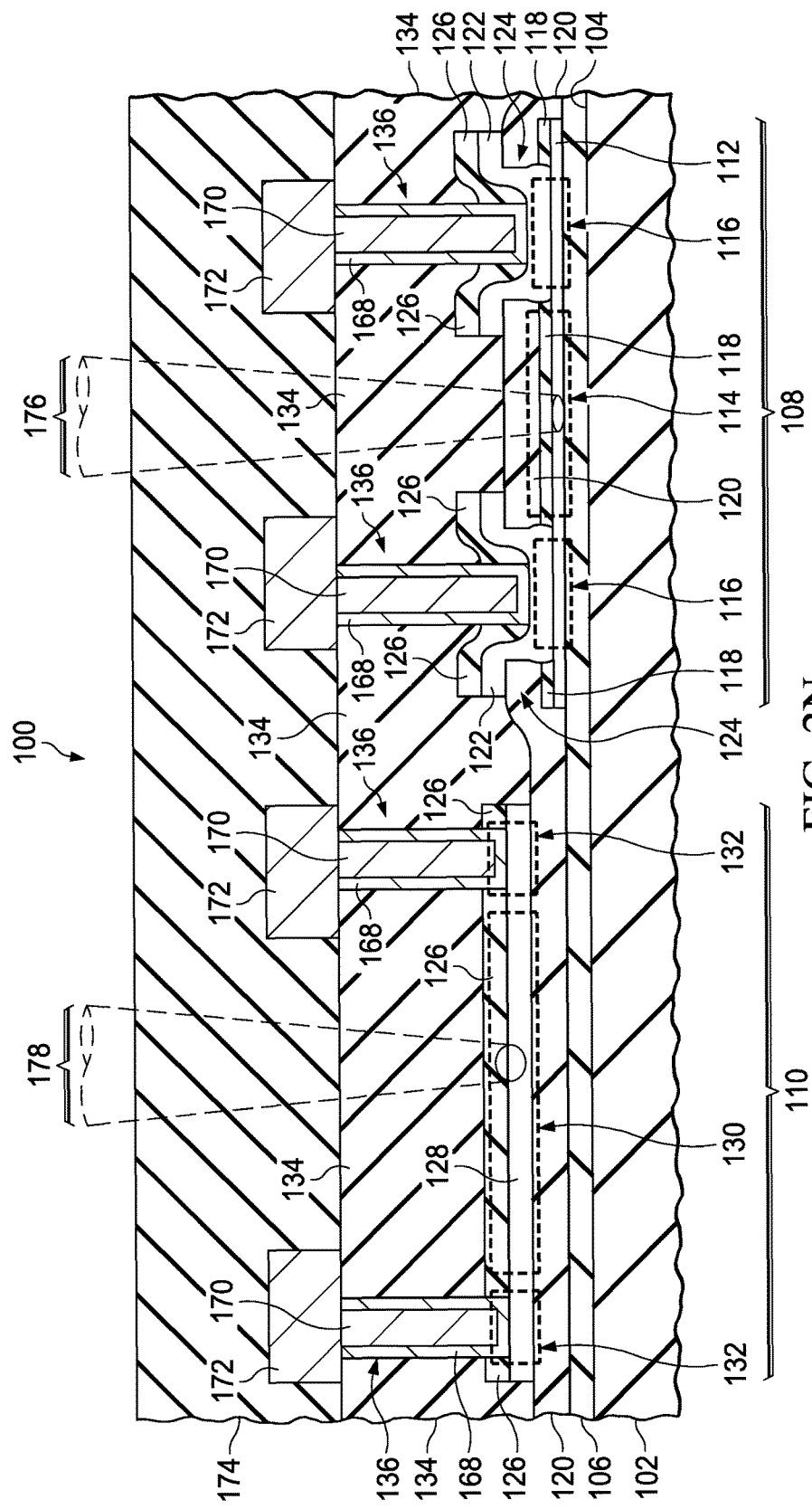

FIG. 2A through FIG. 2N are cross sections of the integrated circuit of FIG. 1, depicted in successive stages of an example method of formation. Referring to FIG. 2A, formation of the integrated circuit 100 proceeds through formation of the lower dielectric layer 102. A method of forming the lower dielectric layer 102 depends on the function of the lower dielectric layer 102. For example, if the lower dielectric layer 102 is a layer of silicon dioxide on an active area of the integrated circuit 100, it may be formed by a thermal oxidation process. If the lower dielectric layer 102 is a layer of field oxide over a substrate of the integrated circuit 100, it may be formed by a local oxidation of silicon (LOCOS) process or a shallow trench isolation (STI) process. If the lower dielectric layer 102 is an IMD layer in an interconnect layer stack of aluminum interconnects, it may be formed in several sub-layers, including a plasma enhanced chemical vapor deposition (PECVD) process followed by an oxide CMP process. If the lower dielectric layer 102 is an ILD layer in the interconnect layer stack, it may be formed in several sub-layers with a cap layer of silicon nitride or silicon oxide nitride $Si_xO_yN_z$.

The optional nucleation dielectric layer 106 may be formed over the lower dielectric layer 102 to provide a surface with a uniform stoichiometry and chemical potential for subsequent formation of a higher sheet layer, as discussed in reference to FIG. 1. The nucleation dielectric layer 106 may be formed, for example, by a PECVD process using tetraethyl orthosilicate (TEOS).

A layer of higher sheet resistance material 138 is formed over the lower dielectric layer 102, on the nucleation dielectric layer 106 if present. The layer of higher sheet resistance material 138 may be 1 nanometer to 30 nanometers thick, and may include for example, nickel chromium, nickel chromium aluminum, silicon chromium, carbon-doped silicon chromium, silicon chromium aluminum, tantalum nitride, titanium nitride, silicon, germanium, and/or cermet. The layer of higher sheet resistance material 138 may be formed, for example, by a sputter process, a reactive sputter process, an evaporation process or an atomic layer deposition (ALD) process. An optional layer of protective dielectric material 140 may be formed on the layer of higher sheet resistance material 138. The protective dielectric material 140 may be, for example, 2 nanometers to 6 nanometers of silicon dioxide. Forming a uniform layer of silicon dioxide 2 nanometers to 6 nanometers thick may require tight control of process parameters. A PECVD process using silane and nitrous oxide or water vapor may produce a thickness within a desired range.

A higher sheet mask 142 is formed over the layer of higher sheet resistance material 138, and over the layer of protective dielectric material 140 if present, to cover an area for the higher sheet layer 112 of FIG. 1 and expose an area for the lower sheet resistor 110. The higher sheet mask 142 may include photoresist formed by a photolithographic process. The higher sheet mask 142 may also include anti-reflection material such as an organic bottom anti-reflection coat (BARC) not shown in FIG. 2A.

Referring to FIG. 2B, a higher sheet etch process 144 is performed which removes the layer of protective dielectric material 140 and the layer of higher sheet resistance material 138 where exposed by the higher sheet mask 142, to form the protective dielectric layer 118 and the higher sheet layer 112, respectively. If the higher sheet mask 142 includes BARC, the BARC is removed in the areas exposed by the higher sheet mask 142 before removing the layer of protective dielectric material 140 and the layer of higher sheet resistance material 138. The BARC may be removed, for example by an endpointed reactive ion etch (RIE) process using oxygen. A portion of the nucleation dielectric layer 106 may also be removed by the higher sheet etch process 144. The higher sheet etch process 144 may include, for example, an RIE process using fluorine radicals, as depicted schematically in FIG. 2B. The RIE process may also use chlorine radicals and possibly oxygen, depending on the composition of the layer of higher sheet resistance material 138. The higher sheet etch process 144 may include a timed etch, due to the low thickness of the layer of protective dielectric material 140 and the layer of higher sheet resistance material 138. The higher sheet mask 142 is subsequently removed, for example by an ash process followed by a wet clean process. The protective dielectric layer 118 may advantageously reduce degradation of the higher sheet layer 112 during removal of the higher sheet mask 142.

Referring to FIG. 2C, the intermediate dielectric layer 120 is formed over the higher sheet layer 112, the protective dielectric layer 118 and the nucleation dielectric layer 106. The intermediate dielectric layer 120 may be 100 nanometers to 150 nanometers thick, and may include silicon dioxide-based dielectric material. The intermediate dielectric layer 120 may be formed, for example, by a PECVD process using TEOS, or a PECVD process using silane and nitrous oxide or water vapor. In one version of the instant example, the intermediate dielectric layer 120 may be formed by a process similar to the process used to form the protective dielectric layer 118, so that a composition of the intermediate dielectric layer 120 and the protective dielectric layer 118 are substantially equal, which may provide similar etch rates during a subsequent intermediate via etch process, thereby advantageously providing a desired profile to the intermediate via holes 124 of FIG. 1.

An intermediate via mask 146 is formed over the intermediate dielectric layer 120. The intermediate via mask 146 exposes the intermediate dielectric layer 120 over areas for the head regions 116 of the higher sheet layer 112, and covers the area for the body region 114 of the higher sheet layer 112. In the instant example, the intermediate via mask 146 also covers the area for the lower sheet resistor 110. The intermediate via mask 146 may include photoresist and possibly anti-reflection material, and may be formed similarly to the higher sheet mask 142 of FIG. 2A and FIG. 2B.

Referring to FIG. 2D, a first intermediate via etch process 148 removes a portion of the intermediate dielectric layer 120 in the areas exposed by the intermediate via mask 146 to partially form the intermediate via holes 124. The first intermediate via etch process 148 may include an RIE process using fluorine radicals, as indicated schematically in FIG. 2D, to reduce undercut of the intermediate dielectric layer 120 and the protective dielectric layer 118. Other etch process and etch chemistries for the first intermediate via etch process 148 are within the scope of the instant example. The first intermediate via etch process 148 may include a timed etch, stopping in the intermediate dielectric layer 120 or the protective dielectric layer 118, so as to avoid degrading the higher sheet layer 112 in the head regions 116 by high energy ions of the RIE process 148. The intermediate via mask 146 may optionally be left in place after the first intermediate via etch process 148 is completed, or may be removed at this point.

Referring to FIG. 2E, a second intermediate via etch process 150 removes remaining portions of the intermediate dielectric layer 120 and/or the protective dielectric layer 118 to complete the intermediate via holes 124 and to expose the higher sheet layer 112 in the head regions 116. The second intermediate via etch process 150 may include, for example, a wet etch process using a dilute aqueous solution of hydrofluoric acid, to provide some etch selectivity to the higher sheet layer 112. In versions of the instant example in which the higher sheet layer 112 contains an effective amount of silicon, an etch rate of the higher sheet layer 112 in the dilute aqueous solution of hydrofluoric acid may be significantly slower than an etch rate of the intermediate dielectric layer 120 and/or the protective dielectric layer 118, advantageously enabling effective removal of the intermediate dielectric layer 120 and/or the protective dielectric layer 118 while leaving an adequate portion of the higher sheet layer 112 under the intermediate via holes 124. Other etch processes for the second intermediate via etch process 150 are within the scope of the instant example. Forming the intermediate dielectric layer 120 and the protective dielectric layer 118 using similar processes to provide similar compositions may advantageously reduce undercut of the intermediate dielectric layer 120 and the protective dielectric layer 118 from the second intermediate via etch process 150. Similarly, forming the intermediate dielectric layer 120 and the protective dielectric layer 118 to have a total thickness less than 160 nanometers may advantageously maintain the undercut to an acceptable extent. Undercut of the intermediate dielectric layer 120 and the protective dielectric layer 118 undesirably expands a lateral dimension of a contact boundary between the higher sheet layer 112 and the upper head layers 122 of FIG. 1, which affects a total resistance of the higher sheet resistor 108. Variation in the undercut adversely impacts consistency of the total resistance of the higher sheet resistor 108, and so minimizing the undercut advantageously improves the consistency of the total resistance.

Referring to FIG. 2F, the intermediate via mask 146, if present, is removed. The intermediate via mask 146 may be removed by an ash process 152 followed by a wet clean process. The ash process 152 and the subsequent wet clean process may be adjusted to reduce degradation of the exposed higher sheet layer 112 in the head regions 116. In an alternate version of the instant example, the intermediate via mask 146 may be removed prior to performing the second intermediate via etch process 150 of FIG. 2E, so as to further reduce degradation of the exposed higher sheet layer 112 in the head regions 116.

Referring to FIG. 2G, a layer of lower sheet resistance material 154 is formed over the intermediate dielectric layer 120, extending into the intermediate via holes 124 and making contact with the higher sheet layer 112 in the head regions 116. The layer of lower sheet resistance material 154 is laser-trimmable, is thicker than the higher sheet layer 112, and has a sheet resistance less than the sheet resistance of the higher sheet layer 112. The layer of lower sheet resistance material 154 may have a similar composition to the layer of higher sheet resistance material 138 of FIG. 2A, and may be formed by a similar process as used for the layer of higher sheet resistance material 138, to produce a thicker layer of similar material.

A layer of hard mask material 156 is formed over the layer of lower sheet resistance material 154. The layer of hard mask material 156 may be, for example, 75 nanometers to 150 nanometers thick, and may include one or more sub-layers of hard mask materials, as described in reference to the hard mask 126 of FIG. 1. The layer of hard mask material 156 may be formed, for example, by one or more PECVD processes. Silicon dioxide in the layer of hard mask material 156 may be formed by a PECVD process using TEOS. Silicon nitride in the layer of hard mask material 156 may be formed by a PECVD process using bis(tertiary-butyl-amino) silane (BTBAS). $Si_xO_yN_z$ in the layer of hard mask material 156 may be formed by a PECVD process using a combination of TEOS and BTBAS.

A lower sheet mask 158 is formed over the layer of hard mask material 156 to cover an area for the lower sheet resistor 110 and areas for the upper head layers 122 of FIG. 1. The lower sheet mask 158 may include photoresist formed by a photolithographic process and may optionally include organic anti-reflection material such as BARC, not shown in FIG. 2G. The lower sheet mask 158 exposes an area over the body region 114 of the higher sheet resistor 108 separating the areas for the upper head layers 122.

Referring to FIG. 2H, a hard mask etch process 160 removes dielectric material from the layer of hard mask material 156 of FIG. 2G where exposed by the lower sheet mask 158 to form the hard mask 126. The hard mask etch process 160 may include, for example, an RIE process using fluorine radicals, as depicted schematically in FIG. 2H. The hard mask etch process 160 is terminated after exposing the layer of lower sheet resistance material 154, so as to minimize inorganic material from the layer of lower sheet resistance material 154 being deposited on the lower sheet mask 158. Inorganic material on the lower sheet mask 158 has been demonstrated to increase process complexity during subsequent removal of the lower sheet mask 158.

Referring to FIG. 2I, the lower sheet mask 158 is removed before etching the layer of lower sheet resistance material 154. The lower sheet mask 158 may be removed by an ash process 162 as depicted schematically in FIG. 2I, followed by a wet clean process. The hard mask 126 is left in place after the lower sheet mask 158 is removed. Removing the lower sheet mask 158 before etching the layer of lower sheet resistance material 154 may advantageously facilitate the ash process 162 by minimizing inorganic material on the lower sheet mask 158, as discussed in reference to FIG. 2H.

Referring to FIG. 2J, the layer of lower sheet resistance material 154 of FIG. 2I is removed by a lower sheet etch process 164 where exposed by the hard mask 126 to form the upper head layers 122 and the lower sheet layer 128. The lower sheet etch process 164 may be an RIE process using fluorine radicals, as depicted schematically in FIG. 2J. The RIE process may also use chlorine radicals and oxygen, depending on the composition of the lower sheet layer 128. For example, in implementations of the instant example wherein the layer of lower sheet resistance material 154 includes chromium, the chlorine radicals and oxygen may form a volatile compound with the chromium, facilitating the lower sheet etch process 164. A portion of the hard mask 126 may be removed by the lower sheet etch process 164. A thickness of the hard mask 126 is selected to provide adequate masking during the lower sheet etch process 164 while minimizing process requirements for the hard mask etch process 160 of FIG. 2H. A portion, but not all, of the intermediate dielectric layer 120 may be removed by the lower sheet etch process 164 where exposed by the upper head layers 122 and the lower sheet layer 128. The hard mask 126 may be left in place after the lower sheet etch process 164 is completed.

Referring to FIG. 2K, the ILD layer 134 is formed over an existing top surface of the integrated circuit 100, covering the higher sheet resistor 108 and the lower sheet resistor 110. The ILD layer 134 may be formed, for example, by a sequence of PECVD processes to form sub-layers, possibly including an etch stop layer at a bottom of the ILD layer 134, a main dielectric layer, and a cap layer at a top of the ILD layer 134. The etch stop layer and the cap layer may be formed by PECVD processes using TEOS and/or BTBAS. The main dielectric layer may be formed by various PECVD processes, depending on the composition of the sub-layers in the main dielectric layer.

Via holes 166 are formed through the ILD layer 134 and through the hard mask 126 to expose the upper head layers 122 of the higher sheet resistor 108 and to expose the lower sheet layer 128 in the head regions 132 of the lower sheet resistor 110. The via holes 166 may be formed by forming a via mask over the ILD layer which exposes areas for the via holes 166 and removing dielectric material from the ILD layer 134 in the areas exposed by the via mask by an RIE process. The via mask is subsequently removed. The via holes 166 may be formed concurrently with other via holes through the ILD layer 134.

Referring to FIG. 2L, a layer of via liner metal 168 is formed over the ILD layer 134, extending into the via holes 166 and making contact with the upper head layers 122 of the higher sheet resistor 108 and the lower sheet layer 128 in the head regions 132 of the lower sheet resistor 110. The layer of via liner metal 168 may include, for example, a sub-layer of titanium formed by a sputter process, followed by a sub-layer of titanium nitride formed by a reactive sputter process or an ALD process. A layer of via fill metal 170 is formed on the layer of via liner metal 168, filling the via holes 166 and extending over the ILD layer 134. The layer of via fill metal 170 may comprise tungsten, formed by a metal organic chemical vapor deposition (MOCVD) process using $WF_6$. The sub-layer of titanium in the layer of via liner metal 168 may advantageously provide a low resistance contact to the upper head layers 122 and the lower sheet layer 128.

Referring to FIG. 2M, the layer of via fill metal 170 and the layer of via liner metal 168 are removed from over the ILD layer 134, leaving the layer of via fill metal 170 and the layer of via liner metal 168 disposed through the ILD layer 134 to form the vias 136. The layer of via fill metal 170 and the layer of via liner metal 168 may be removed by a metal CMP process and/or an etchback process.

Metal interconnects 172 are formed over the ILD layer 134, making contact with the vias 136. The metal interconnects 172 may be formed by forming an interconnect metal layer stack comprising an adhesion layer including titanium, a layer of aluminum with a few percent silicon and/or copper, and a cap layer of titanium nitride. An interconnect mask is formed over the interconnect metal layer stack, covering areas for the metal interconnects 172. An RIE process using chlorine radicals is used to remove the interconnect metal layer stack where exposed by the interconnect mask, leaving the metal interconnects 172. The interconnect mask is subsequently removed.

An IMD layer 174 is formed over the ILD layer 134 and the metal interconnects 172. The IMD layer 174 may include a conformal layer of silicon nitride or silicon dioxide formed by a PECVD process, followed by a fill layer of dielectric material, such as silicon dioxide, PSG, BPSG, OSG, low-k dielectric material, and/or SOG. The fill layer may be planarized by an oxide CMP process, as depicted in FIG.

2M. The IMD layer 174 may further include a cap layer of silicon nitride formed by a PECVD process.

The metal interconnects 172 provide electrical connections to the higher sheet resistor 108 and the lower sheet resistor 110. Additional ILD layers, metal interconnect layers and IMD layers are within the scope of the instant example.

Referring to FIG. 2N, a resistance of the higher sheet resistor 108 is adjusted by modifying a portion of the higher sheet resistor 108, for example a portion of body region 114, using a laser, as depicted schematically in FIG. 2N by a first laser beam 176, a process commonly referred to as laser trimming. The portion of the higher sheet resistor 108 may be modified by the first laser beam 176 for example by cutting the portion of the body region 114, by partially removing the portion of the body region 114 so as to increase the total resistance of the higher sheet resistor 108, or by heating the portion of the body region 114 to change the sheet resistance of the portion of the body region 114, possibly lowering the total resistance of the higher sheet resistor 108. The first laser beam 176 is focused through the intermediate dielectric layer 120, the ILD layer 134 and the IMD layer 174. A resistance of the lower sheet resistor 110 is adjusted by modifying a portion of the lower sheet resistor 110, for example a portion of the body region 130, using a laser, depicted schematically in FIG. 2N by a second laser beam 178, which may be the first laser beam 176 at a different point in time. The portion of the lower sheet resistor 110 may be modified in a similar way as the portion of the higher sheet resistor 108. The second laser beam 178 is also focused through the intermediate dielectric layer 120, the ILD layer 134 and the IMD layer 174. Focus and power settings for the first laser beam 176 and the second laser beam 178 may be substantially equal, due to the higher sheet resistor 108 and the lower sheet resistor 110 being at substantially a same depth in the integrated circuit 100, that is, being disposed above the lower dielectric layer 102 and below the ILD layer 134. Having the focus and power settings being substantially equal may advantageously reduce cost and complexity of the laser trimming process, by enabling the lower sheet resistor 110 being laser trimmed sequentially with the higher sheet resistor 108 without necessitating a change in the laser power and focus settings.

Figure 3:
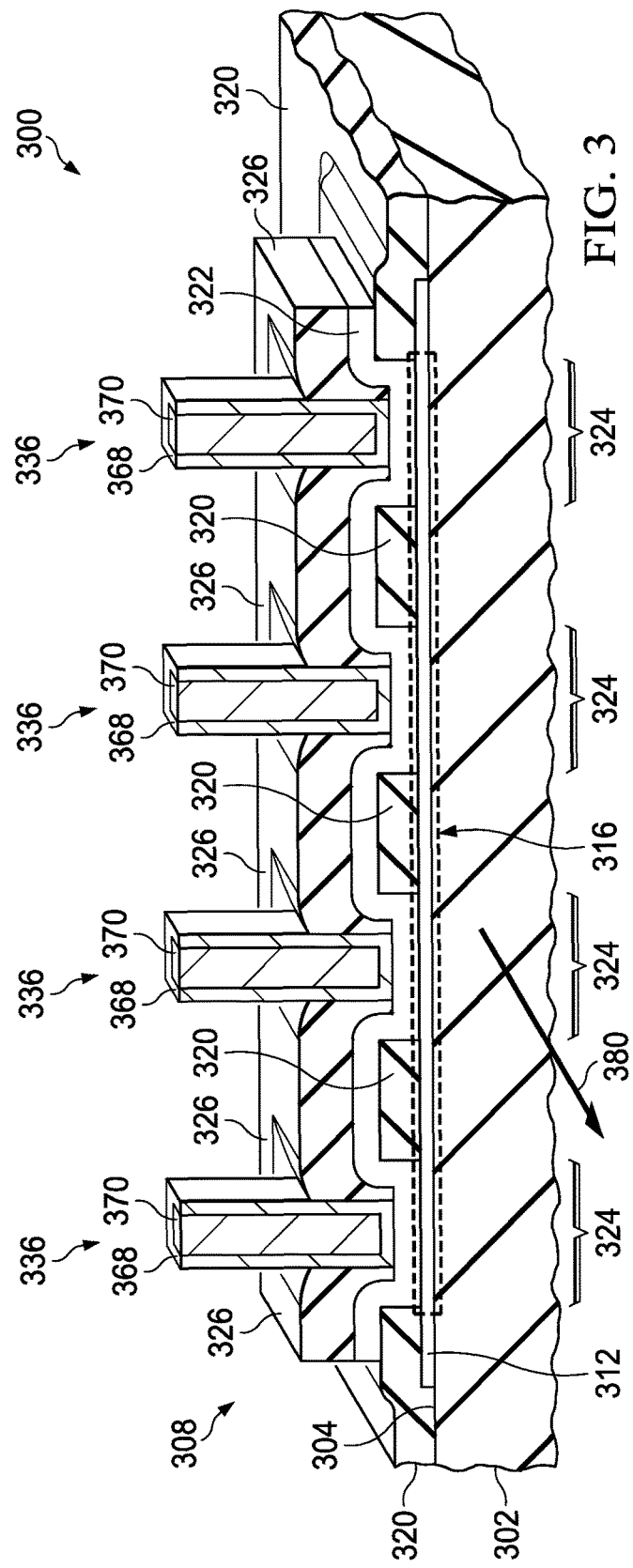
FIG. 3 through FIG. 5 depict alternate examples of head regions of higher sheet resistors.
Figure 4:
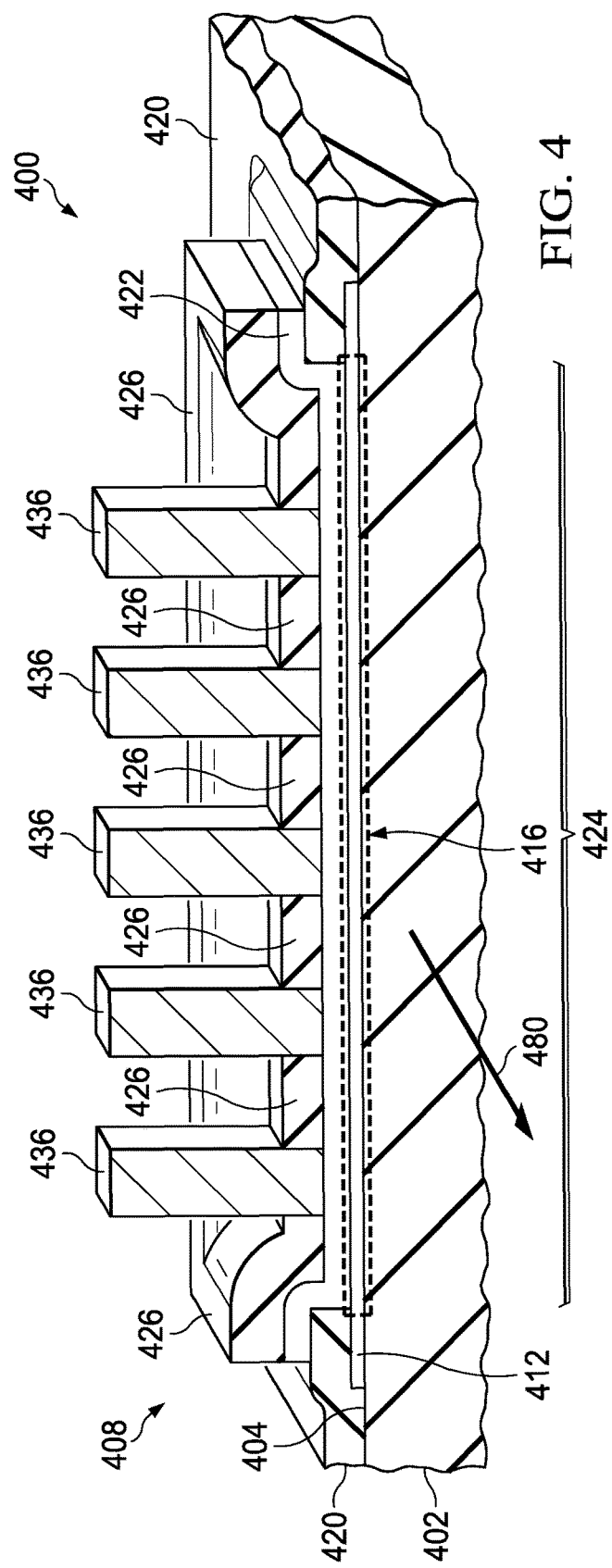
Figure 5:
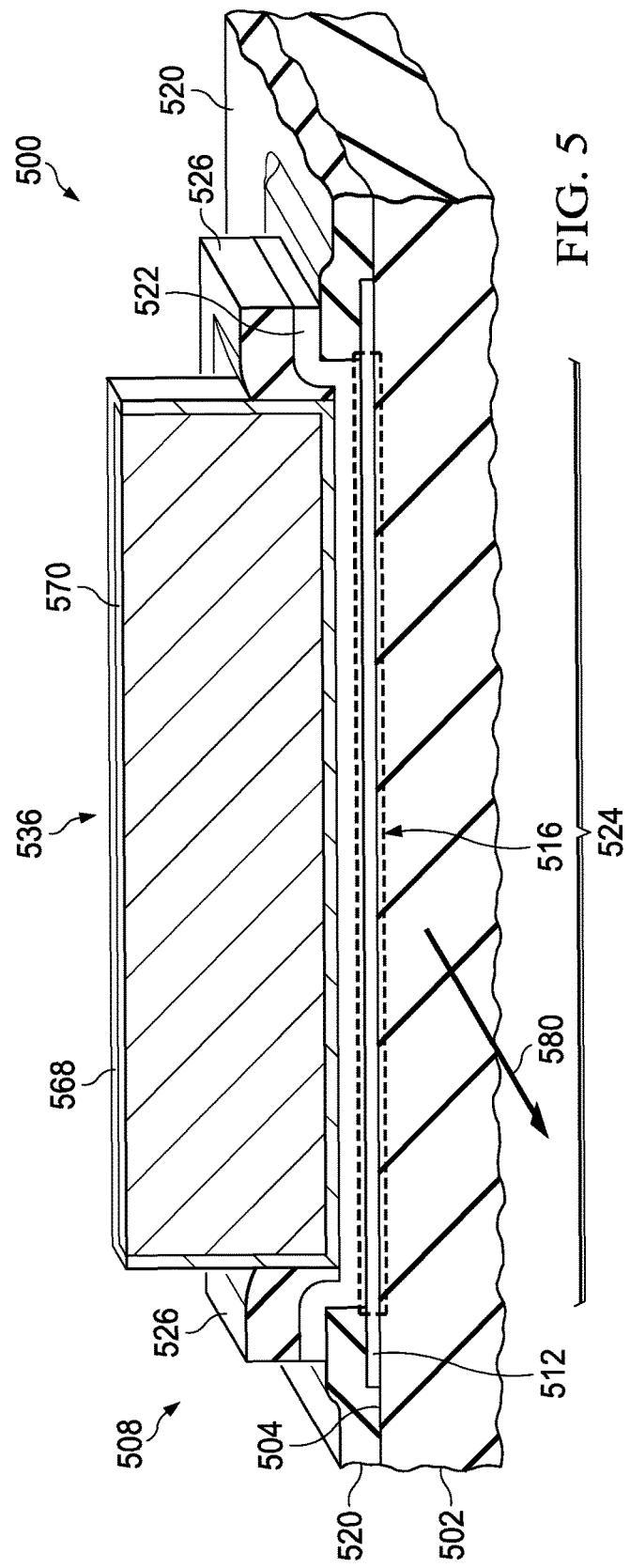

FIG. 3 through FIG. 5 depict alternate examples of head regions of higher sheet resistors. Referring to FIG. 3, an integrated circuit 300 has a higher sheet resistor 308 and a lower sheet resistor, not shown in FIG. 3, both disposed over a top surface 304 of a lower dielectric layer 302. The higher sheet resistor 308 includes a higher sheet layer 312 as described in reference to FIG. 1. During operation of the integrated circuit 300, current flow through the higher sheet layer 312 is perpendicular to the plane of cross section of FIG. 3, indicated by current direction vector 380. An intermediate dielectric layer 320 is disposed over the higher sheet layer 312 and the lower dielectric layer 302. In the instant example, a plurality of intermediate via holes 324 are disposed through the intermediate dielectric layer 320 in a head region 316 of the higher sheet resistor 308. The plurality of intermediate via holes 324 may be distributed across a width of the higher sheet layer 312, perpendicular to the current direction vector 380, as depicted in FIG. 3. An upper head layer 322 of conductive material as described in reference to FIG. 1 is disposed in the intermediate via holes 324, making contact with the higher sheet layer 312. A hard mask 326 of dielectric material is disposed over the upper head layer 322, as described in reference to FIG. 1 and FIG. 2C through FIG. 2F. In the instant example, a plurality of vias 336 are disposed through the hard mask 326 and contact the upper head layer 322. The vias 336 may include a via liner metal 368 and a via fill metal 370 as described in reference to FIG. 2L and FIG. 2M, and may have substantially equidimensional lateral cross sections in the instant example, that is, the lateral cross sections have substantially equal lateral length and width. Vias with substantially equidimensional lateral cross sections may have, for example, a round shape, a rounded-square shape or a square shape. In the instant example, there is exactly one via 336 disposed in each intermediate via hole 324. The vias 336 extend through an ILD layer, not shown in FIG. 3, disposed above the hard mask 326 and through the intermediate dielectric layer 320, as described in reference to FIG. 1 and FIG. 2M. Having the plurality of vias 336 making contact to the higher sheet layer 312 through the upper head layer 322 across a width of the higher sheet layer 312 perpendicular to the current direction vector 380 through the higher sheet layer 312 may advantageously provide uniform current flow and low head resistance. Having the plurality of intermediate via holes may advantageously provide increased process margin in fabrication flows using such intermediate via holes, compared to large area intermediate via holes which may be more difficult to etch cleanly. Having the plurality of vias 336 with equidimensional lateral cross sections may advantageously provide increased process margin in fabrication flows using such vias, compared to slot vias which may be more difficult to etch and fill cleanly.

Referring to FIG. 4, an integrated circuit 400 has a higher sheet resistor 408 and a lower sheet resistor, not shown in FIG. 4, both disposed over a top surface 404 of a lower dielectric layer 402. The higher sheet resistor 408 includes a higher sheet layer 412 as described in reference to FIG. 1. During operation of the integrated circuit 400, current flow through the higher sheet layer 412 is perpendicular to the plane of cross section of FIG. 4, indicated by current direction vector 480. An intermediate dielectric layer 420 is disposed over the higher sheet layer 412 and the lower dielectric layer 402. A large-area intermediate via hole 424 is disposed through the intermediate dielectric layer 420 in a head region 416 of the higher sheet resistor 408. The large-area intermediate via hole 424 may extend across more than half a width of the higher sheet layer 412 perpendicular to the current direction vector 480, as depicted in FIG. 4. An upper head layer 422 of conductive material as described in reference to FIG. 1 is disposed in the large-area intermediate via hole 424, making contact with the higher sheet layer 412 along the width of the large-area intermediate via hole 424. A hard mask 426 of dielectric material is disposed over the upper head layer 422. A plurality of vias 436 having equidimensional lateral cross sections are disposed through the hard mask 426 and contact the upper head layer 422. The vias 436 may have a homogeneous composition of metal, as depicted in FIG. 4, or may include a liner metal and fill metal as described in other examples disclosed herein. In the instant example, the plurality of the vias 436 is disposed in the large-area intermediate via hole 424. The vias 436 extend through an ILD layer, not shown in FIG. 3, disposed above the hard mask 426 and through the intermediate dielectric layer 420. Having the large-area intermediate via hole 424 may advantageously reduce a head resistance of the higher sheet resistor 408 due to the large contact area between the upper head layer 422 and the higher sheet layer 412. Having the plurality of vias 436 with equidimensional lateral cross section may accrue the advantages described in reference to FIG. 3. Having plurality of vias 436 and the large contact area between the upper head layer 422 and the higher sheet layer 412, across a width of the higher sheet layer 412 perpendicular to the current direction vector 480, may advantageously provide uniform current flow and low head resistance.

Referring to FIG. 5, an integrated circuit 500 has a higher sheet resistor 508 and a lower sheet resistor, not shown in FIG. 5, both disposed over a top surface 504 of a lower dielectric layer 502. The higher sheet resistor 508 includes a higher sheet layer 512 as described in reference to FIG. 1. During operation of the integrated circuit 500, current flow through the higher sheet layer 512 is perpendicular to the plane of cross section of FIG. 5, indicated by current direction vector 580. An intermediate dielectric layer 520 is disposed over the higher sheet layer 512 and the lower dielectric layer 502. A large-area intermediate via hole 524 is disposed through the intermediate dielectric layer 520 in a head region 516 of the higher sheet resistor 508. The large-area intermediate via hole 524 may extend across more than half a width of the higher sheet layer 512 perpendicular to the current direction vector 580, as depicted in FIG. 5. An upper head layer 522 of conductive material as described in reference to FIG. 1 is disposed in the large-area intermediate via hole 524, making contact with the higher sheet layer 512 along the width of the large-area intermediate via hole 524. A hard mask 526 of dielectric material is disposed over the upper head layer 522. A slot via 536 having a rectangular lateral cross section is disposed through the hard mask 526 and contacts the upper head layer 522. In the instant example, the via 536 is disposed in the large-area intermediate via hole 524. The slot via 536 may include a via liner metal 568 and a via fill metal 570 as described in reference to FIG. 2L and FIG. 2M. The via 536 extends through an ILD layer, not shown in FIG. 3, disposed above the hard mask 526 and the intermediate dielectric layer 520. Having the large-area intermediate via hole 524 may advantageously reduce a head resistance of the higher sheet resistor 508 due to the large contact area between the upper head layer 522 and the higher sheet layer 512. Having the slot via 536 extending across the width of the large-area intermediate via hole 524 may advantageously provide more lower parasitic resistance in series with the higher sheet resistor 508 compared to a similar resistor with discrete vias.

Figure 6:
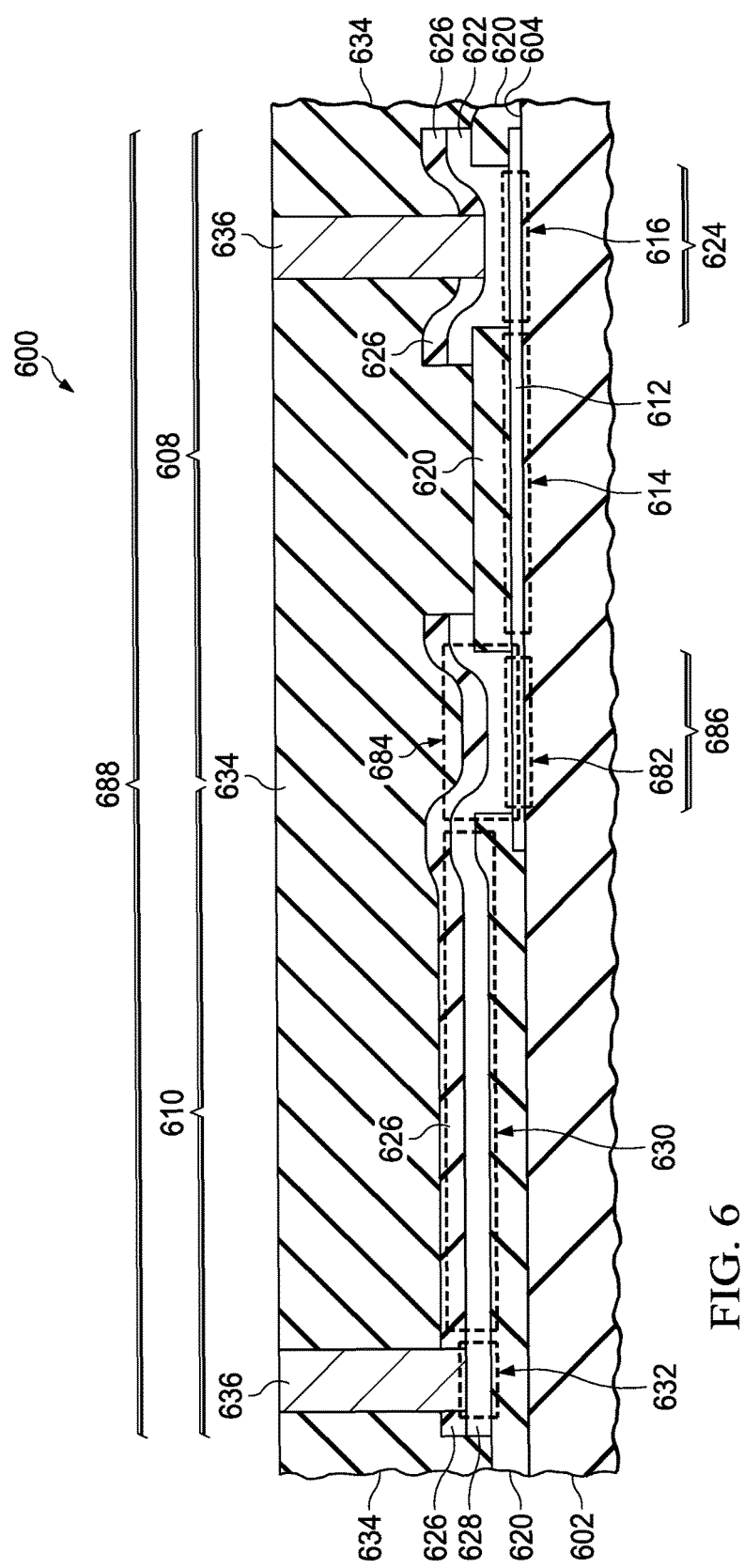
FIG. 6 is a cross section of another example integrated circuit containing a higher sheet resistor and a lower sheet resistor.

FIG. 6 is a cross section of another example integrated circuit containing a higher sheet resistor and a lower sheet resistor. The integrated circuit 600 has a higher sheet resistor 608 and a lower sheet resistor 610 disposed over a top surface 604 of a lower dielectric layer 602. The higher sheet resistor 608 has a higher sheet layer 612 as described in reference to FIG. 1 disposed over the lower dielectric layer 602. A first head region 616 of the higher sheet layer 612 is located proximate to a first end of the higher sheet layer 612. A second head region 682 of the higher sheet layer 612 is located proximate to a second end of the higher sheet layer 612, opposite from the first head region 616. A body region 614 of the higher sheet layer 612 is located between the first head region 616 and the second head region 682. An intermediate dielectric layer 620 is disposed over the higher sheet layer 612 and the lower dielectric layer 602 in an area for the lower sheet resistor 610. The intermediate dielectric layer 620 has the properties described in reference to FIG. 1. A first intermediate via hole 624 and a second intermediate via hole 686 extend through the intermediate dielectric layer 620 over the first head region 616 and over the second head region 682, respectively. The intermediate dielectric layer 620 covers the body region 614 of the higher sheet layer 612. An upper head layer 622 is disposed in the first intermediate via hole 624 over the first head region 616, contacting the higher sheet layer 612 at the first head region 616. The higher sheet resistor 608 is free of additional head layers over the upper head layer 622. A lower sheet layer 628 of the lower sheet resistor 610 is disposed over the intermediate dielectric layer 620, extending over the area for the lower sheet resistor 610 and extending continuously from the area for the lower sheet resistor 610 into the second intermediate via hole 686 over the second head region 682 of the higher sheet layer 612, contacting the higher sheet layer 612 at the second head region 682. The upper head layer 622 and the lower sheet layer 628 have the properties described in reference to FIG. 1, and are formed concurrently as described in reference to FIG. 2G through FIG. 2J. A first head region 632 of the lower sheet layer 628 is located proximate to a first end of the lower sheet layer 628 opposite from the second intermediate via hole 686. A second head region 684 of the lower sheet layer 628 is located in the second intermediate via hole 686. Thus, the lower sheet resistor 610 is connected in series to the higher sheet resistor 608 at the second intermediate via hole 686. A body region 630 of the lower sheet layer 628 is located between the first head region 632 and the second head region 684. The lower sheet resistor 610 is free of head layers over the lower sheet layer 628. A hard mask 626 is disposed over the upper head layer 622 and over the lower sheet layer 628. The hard mask 626 has the properties described in reference to FIG. 1 and is formed as described in reference to FIG. 2G through FIG. 2J. An ILD layer 634 is disposed over the higher sheet resistor 608 and the lower sheet resistor 610. Vias 636 are disposed through the ILD layer 634 and through the hard mask 626. At least one of the vias 636 contacts the lower sheet layer 628 at the first head region 632. At least one of the vias 636 contacts the upper head layer 622. The second head region 684 of the lower sheet layer 628 is free of the vias 636. Both the body region 614 of the higher sheet resistor 608 and the body region 630 of the lower sheet resistor 610 are laser-trimmable. The higher sheet resistor 608 in series with the lower sheet resistor 610 provide a composite resistor 688 which may be laser trimmed to a higher accuracy than either a higher sheet resistor alone or a lower sheet resistor alone. The body region 614 of the higher sheet resistor 608 may be laser trimmed in a coarse trim process, and the body region 630 of the lower sheet resistor 610 may be subsequently trimmed in a fine trim process to provide the composite resistor 688 with a precisely trimmed resistance value. A stand-alone higher sheet resistor and/or a stand-alone lower sheet resistor, as described in reference to FIG. 1, may be contained in the integrated circuit 600 with the composite resistor 688.

Figure 7:
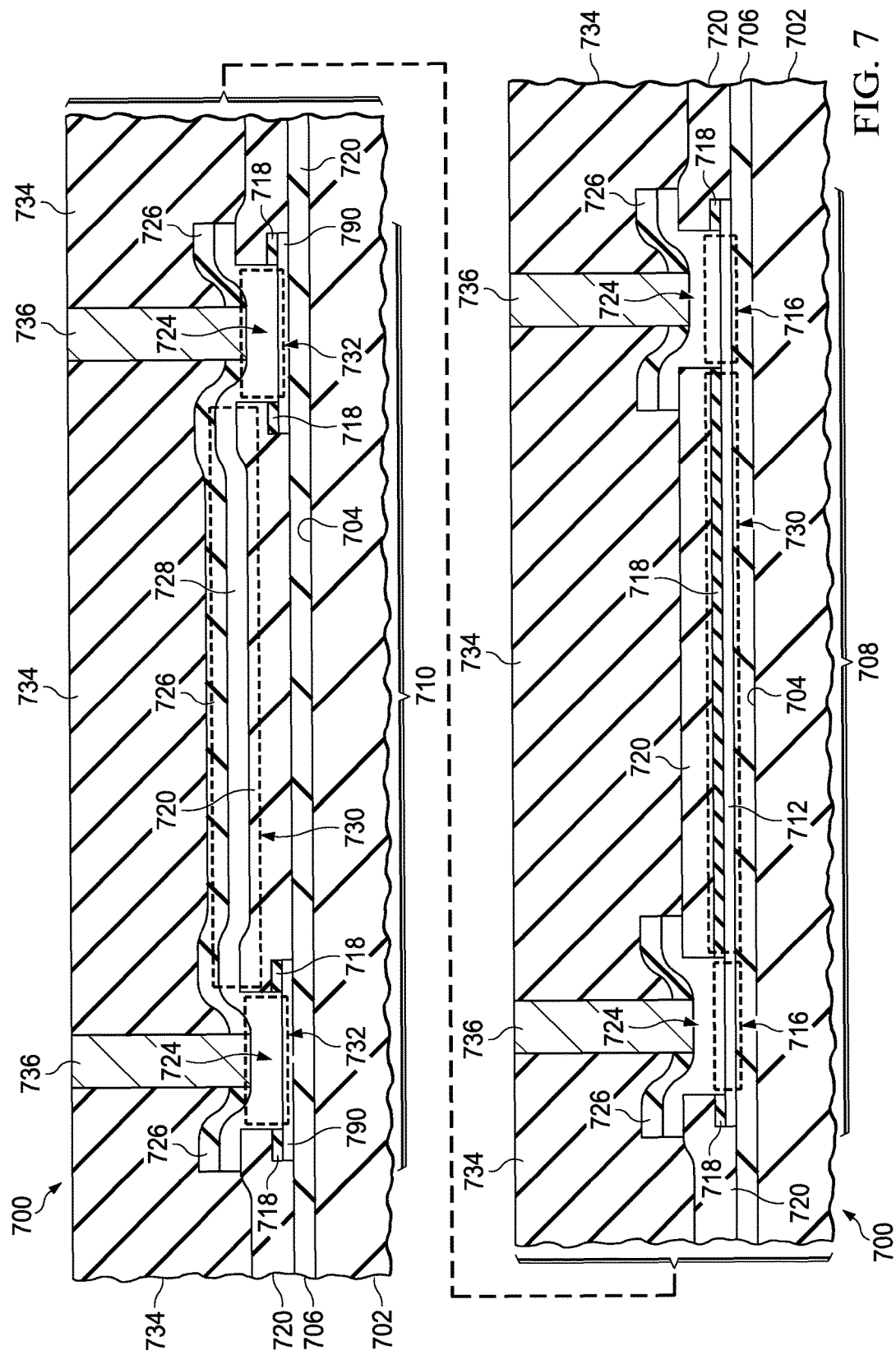
FIG. 7 is cross section of a further example integrated circuit containing a higher sheet resistor and a lower sheet resistor.

FIG. 7 is cross section of a further example integrated circuit containing a higher sheet resistor and a lower sheet resistor. The integrated circuit 700 includes a lower dielectric layer 702. An optional nucleation dielectric layer 706 may possibly be disposed on the top surface 704 of the lower dielectric layer 702. The integrated circuit 700 includes a higher sheet resistor 708 and a lower sheet resistor 710. The higher sheet resistor 708 of the instant example may be similar to the higher sheet resistor 108 described in reference to FIG. 1. The higher sheet resistor 708 has a higher sheet layer 712 which extends through a body region 714 and through head regions 716. The higher sheet layer 712 is laser-trimmable. The higher sheet resistor 708 may possibly include an optional protective dielectric layer 718 disposed over the higher sheet layer 712. An intermediate dielectric layer 720 is disposed over the body region 714. Upper head layers 722, are disposed on the higher sheet layer 712 in the head regions 716, extending through intermediate via holes 724 in the intermediate dielectric layer 720 and the protective dielectric layer 718. The upper head layers 722 are thicker than the higher sheet layer 712, with sheet resistances lower than the higher sheet layer 712. The upper head layers 722 may include one or more sub-layers of the materials described in reference to the higher sheet layer 712, and may have a similar composition to the higher sheet layer 712. The higher sheet resistor 708 is free of additional head layers over the upper head layers 722. A hard mask 726 may be disposed over the upper head layers 722. The hard mask 726 may include one or more sub-layers of silicon dioxide, silicon nitride or other hard mask material.

In the instant example, the intermediate dielectric layer 720 extends through the area for the lower sheet resistor 710. The lower sheet resistor 710 has a lower sheet layer 728 which extends through a body region 730 and through head regions 732 adjacent to the body region 730. In the instant example, the head regions 732 are disposed in instances of the intermediate via holes 724 and contact lower head pads 790 disposed over the lower dielectric layer 702, on the nucleation dielectric layer 706 if present. The lower head pads 790 have a same thickness and composition as the higher sheet layer 712. The protective dielectric layer 718, if present on the higher sheet layer 712, is also present on the lower head pads 790. Thus, the lower sheet resistor 710 and the higher sheet resistor 708 of the instant example have substantially similar head structures. The lower sheet layer 728 is laser-trimmable, and has a same thickness and composition as the upper head layers 722 of the higher sheet resistor 708. The hard mask 726, if present over the upper head layers 722 is also disposed over the lower sheet layer 728. The higher sheet resistor 708 and the lower sheet resistor 710 are advantageously both laser-trimmable with a same laser set up.

An ILD layer 734 is disposed over the higher sheet resistor 708 and the lower sheet resistor 710. Vias 736 are disposed through the ILD layer 734 and make electrical contact to the higher sheet resistor 708 and the lower sheet resistor 710. In the instant example, at least one of the vias 736 extends through the hard mask 726 and contacts each of the upper head layers 722 to provide electrical connections to the higher sheet resistor 708. At least one of the vias 736 extends through the hard mask 726 and contacts the lower sheet layer 728 in each of the head regions 732 to provide electrical connections to the lower sheet resistor 710. Forming the lower sheet resistor 710 with the head regions 732 in the intermediate via holes 724 and with the lower head pads 790 under the head regions 732 may improve process latitude for forming the vias 736 by providing substantially equal thicknesses of the ILD layer 734 above the head regions 716 and 732 of the higher sheet resistor 708 and the lower sheet resistor 710, respectively. Furthermore, forming the lower sheet resistor 710 with the lower head pads 790 under the head regions 732 may improve process latitude for forming the vias 736 by providing substantially equal via-etch-stopping layers in the head regions 716 and 732.

Figure 8:
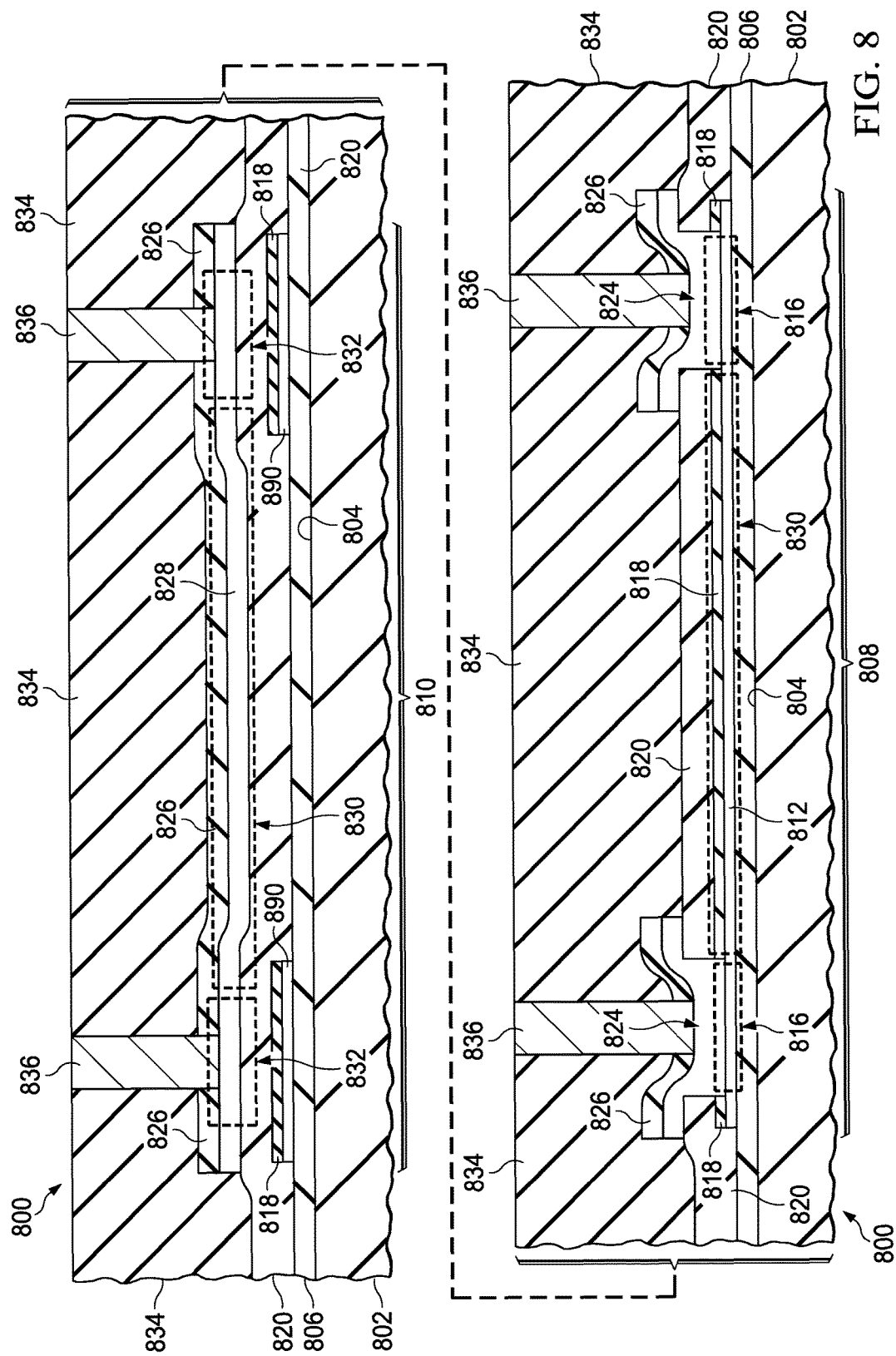
FIG. 8 is cross section of a further example integrated circuit containing a higher sheet resistor and a lower sheet resistor.

FIG. 8 is cross section of a further example integrated circuit containing a higher sheet resistor and a lower sheet resistor. The integrated circuit 800 includes a lower dielectric layer 802, optionally with a nucleation dielectric layer 806 disposed on the top surface 804 of the lower dielectric layer 802. The integrated circuit 800 includes a higher sheet resistor 808 and a lower sheet resistor 810. The higher sheet resistor 808 of the instant example may be similar to the higher sheet resistor 108 described in reference to FIG. 1. The laser-trimmable higher sheet resistor 808 has a higher sheet layer 812 which extends through a body region 814 and through head regions 816. An optional protective dielectric layer 818 may possibly be disposed over the higher sheet layer 812. An intermediate dielectric layer 820 is disposed over the body region 814. Upper head layers 822, are disposed on the higher sheet layer 812 in the head regions 816, extending through intermediate via holes 824. The upper head layers 822 are thicker than the higher sheet layer 812, with sheet resistances lower than the higher sheet layer 812. A hard mask 826 may be disposed over the upper head layers 822.

In the instant example, the intermediate dielectric layer 820 extends throughout the area for the lower sheet resistor 810. The laser-trimmable lower sheet resistor 810 has a lower sheet layer 828 which extends through a body region 830 and through head regions 832 adjacent to the body region 830. In the instant example, the head regions 832 are disposed over, but do not contact, lower head pads 890. The lower head pads 890 have a same thickness and composition as the higher sheet layer 812. The protective dielectric layer 818, if present on the higher sheet layer 812, is also present on the lower head pads 890. The lower sheet layer 828 is laser-trimmable, and has a same thickness and composition as the upper head layers 822 of the higher sheet resistor 808. The hard mask 826, if present over the upper head layers 822 is also disposed over the lower sheet layer 828. The higher sheet resistor 808 and the lower sheet resistor 810 are advantageously both laser-trimmable with a same laser set up.

An ILD layer 834 is disposed over the higher sheet resistor 808 and the lower sheet resistor 810. Vias 836 are disposed through the ILD layer 834 and make electrical contact to the higher sheet resistor 808 and the lower sheet resistor 810. At least one of the vias 836 extends through the hard mask 826 and contacts the lower sheet layer 828 in each of the head regions 832 to provide electrical connections to the lower sheet resistor 810. Forming the lower sheet resistor 810 with the lower head pads 890 under the head regions 832 may improve process latitude for forming the vias 836 by providing additional via-etch-stopping layers under the head regions 832.

Figure 9A:
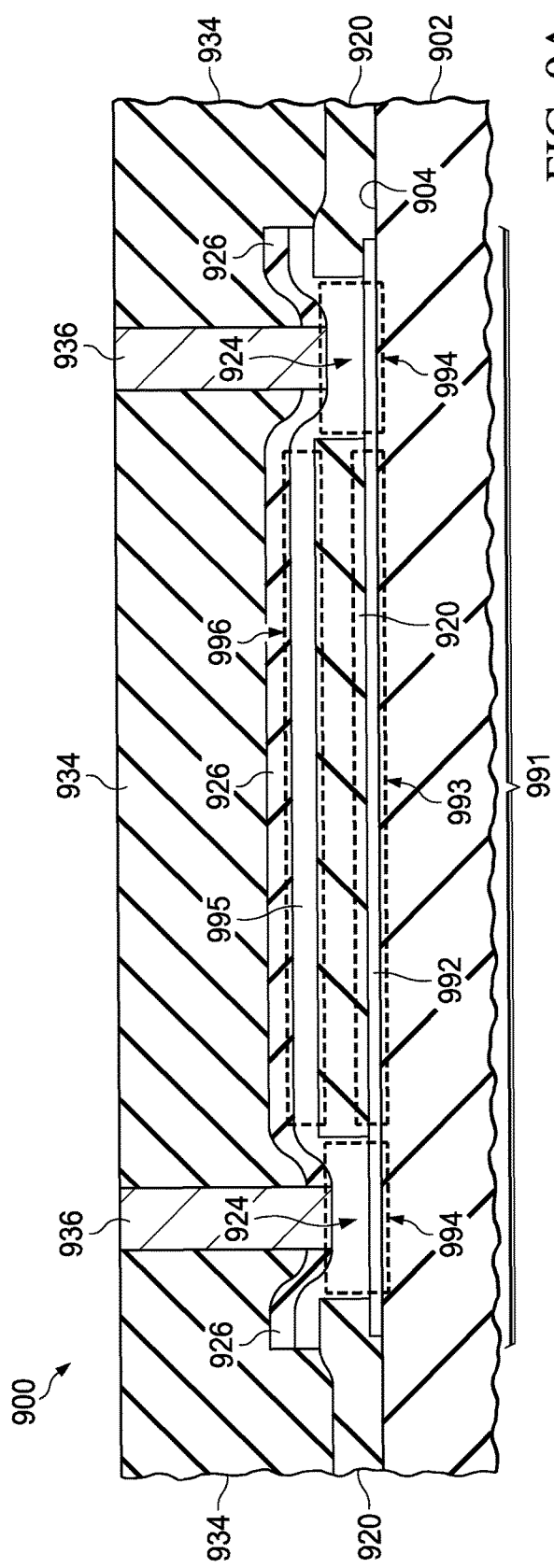
FIG. 9A and FIG. 9B depict an example integrated circuit containing a laser-trimmable composite resistor.
Figure 9B:
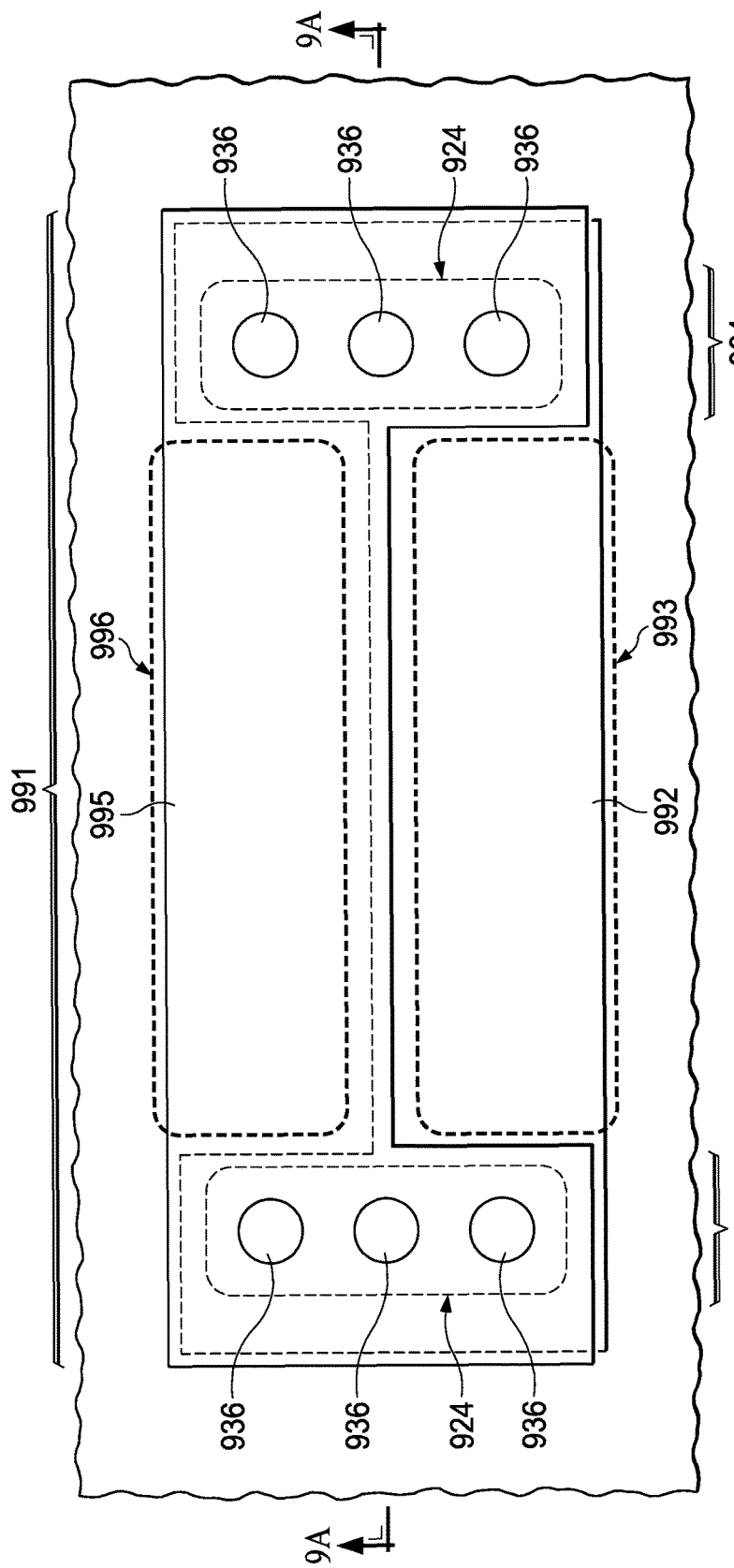

FIG. 9A and FIG. 9B depict an example integrated circuit containing a laser-trimmable composite resistor. Referring to FIG. 9A, which is a cross section of the integrated circuit 900 through the composite resistor 991, the integrated circuit 900 includes a lower dielectric layer 902, and an ILD layer 934 disposed over a top surface 904 of the lower dielectric layer 902. A laser-trimmable higher sheet resistor, not shown, having a higher sheet layer with upper head layers through intermediate via holes, and a laser-trimmable lower sheet resistor, not shown, having a lower sheet layer, are disposed over the lower dielectric layer 902, and under the ILD layer 934, for example as described in any of the examples disclosed herein.

The composite resistor 991 includes a higher sheet layer 992 disposed over the top surface 904 of the lower dielectric layer 902. The higher sheet layer 992 of the composite resistor 991 has a same thickness and composition as the higher sheet layer of the higher sheet resistor, as a result of being formed concurrently. The higher sheet layer 992 of the composite resistor 991 extends through a higher sheet body region 993 and composite head regions 994. An intermediate dielectric layer 920 is disposed over the higher sheet layer 992 of the composite resistor 991 and over the higher sheet layer of the higher sheet resistor, and under the lower sheet layer of the lower sheet resistor, as described in the examples disclosed herein. Intermediate via holes 924 extend through the intermediate dielectric layer 920 in the composite head regions 994 of the composite resistor 991 and in head regions of the higher sheet resistor, as described in the examples disclosed herein. The composite resistor 991 further includes a lower sheet layer 995 disposed over the intermediate dielectric layer 920 and extending into the intermediate via holes 924 to contact the higher sheet layer 992 in the composite head regions 994. The lower sheet layer 995 extends through a lower sheet body region 996. The composite head regions 994 are located at ends of the higher sheet body region 993 and the lower sheet body region 996. A hard mask 926 may be disposed over the lower sheet layer 995 of the composite resistor 991, over the lower sheet layer of the lower sheet resistor and over the upper head layers of the higher sheet resistor. The ILD layer 934 is disposed over the composite resistor 991. Vias 936 are disposed through the ILD layer 934 and the hard mask 926 if present to provide electrical connections to the lower sheet layer 995 in the composite head regions 994, to the upper head layers of the higher sheet resistor and to the head regions of the lower sheet resistor.

Referring to FIG. 9B, which is a top view of the integrated circuit 900, the composite resistor 991 in the instant example has the higher sheet body region 993 and the lower sheet body region 996 with only a small optional overlapping extent, leaving major portions of the higher sheet body region 993 and the lower sheet body region 996 each advantageously exposed for separate laser trimming operations. Configuring the higher sheet body region 993 and the lower sheet body region 996 to partially overlap may advantageously reduce an area of the composite resistor 991. In the instant example, the composite head regions 994 extend across widths of the higher sheet body region 993 and the lower sheet body region 996. The vias 936 make contact to the lower sheet layer 995 in the intermediate via holes 924. Other configurations of the composite resistor 991 are within the scope of the instant example. The composite resistor 991 advantageously provides a resistor having values of characteristics such as TCR between values of the characteristics of the higher sheet resistor and the lower sheet resistor of the integrated circuit 900. The higher sheet resistor, the lower sheet resistor and the composite resistor 991 are all advantageously laser-trimmable using a same laser setup, as a result of being located over the lower dielectric layer 902 and below the ILD layer 934 of FIG. 9A; the ILD layer 934 is not shown in FIG. 9B to more clearly show the structure of the composite resistor 991. The composite resistor 991 is advantageously formed concurrently with the higher sheet resistor and the lower sheet resistor, and does not add fabrication cost or complexity to the process of forming the integrated circuit 900.

Figure 10A:
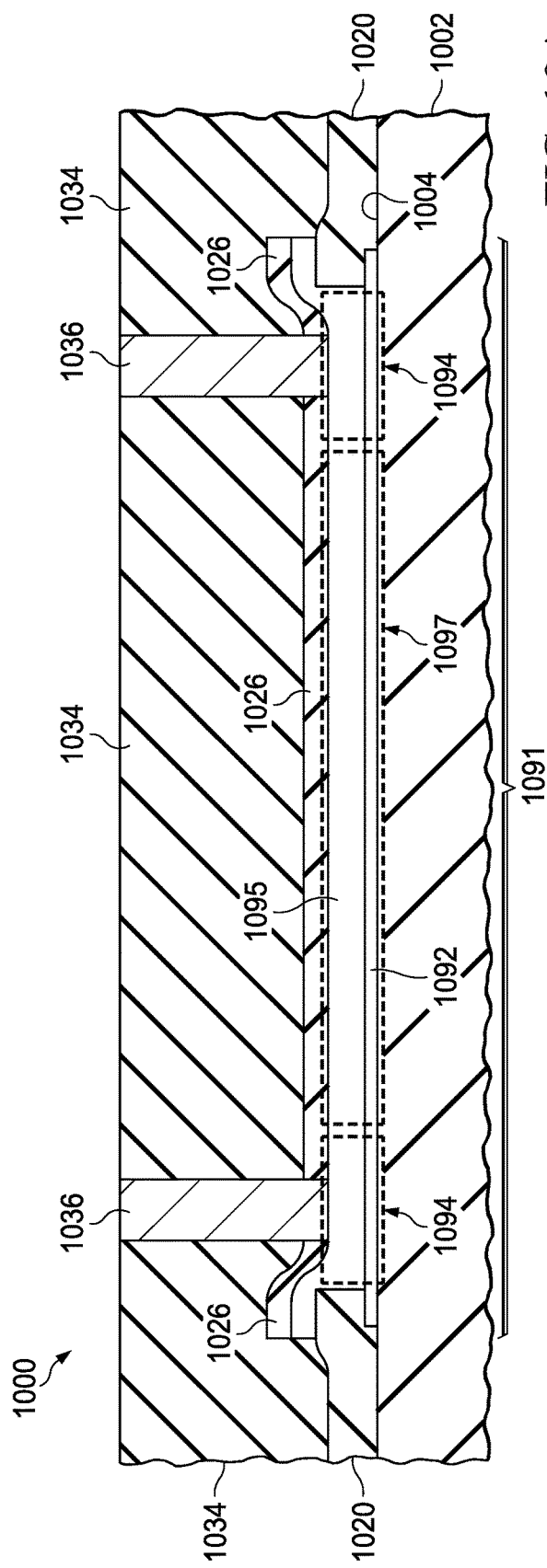

FIG. 10A and FIG. 10B depict an example integrated circuit containing another laser-trimmable composite resistor. Referring to FIG. 10A, which is a cross section of the integrated circuit 1000 through the composite resistor 1091, the integrated circuit 1000 includes a lower dielectric layer 1002, and an ILD layer 1034 disposed over a top surface 1004 of the lower dielectric layer 1002. A laser-trimmable higher sheet resistor, not shown, having a higher sheet layer with upper head layers through intermediate via holes, and a laser-trimmable lower sheet resistor, not shown, having a lower sheet layer, are disposed over the lower dielectric layer 1002, and under the ILD layer 1034, for example as described in any of the examples disclosed herein.

The composite resistor 1091 includes a higher sheet layer 1092 disposed over the top surface 1004 of the lower dielectric layer 1002. The higher sheet layer 1092 of the composite resistor 1091 has a same thickness and composition as the higher sheet layer of the higher sheet resistor, as a result of being formed concurrently. The higher sheet layer 1092 of the composite resistor 1091 extends through a composite body region 1097 and composite head regions 1094. The composite head regions 1094 are located at ends of the composite body region 1097. An intermediate dielectric layer 1020 is disposed over the lower dielectric layer 1002, and over the higher sheet layer of the higher sheet resistor and under the lower sheet layer of the lower sheet resistor, with the intermediate via holes of the higher sheet resistor extending through the intermediate dielectric layer 1020 over head regions of the higher sheet resistor, as described in the examples disclosed herein. The intermediate dielectric layer 1020 partially overlaps the higher sheet layer 1092 around a lateral boundary of the higher sheet layer 1092. In the instant example, the intermediate dielectric layer 1020 is removed from the composite body region 1097 and the composite head regions 1094, concurrently with forming the intermediate via holes of the higher sheet resistor, for example as described in reference to FIG. 2C through FIG. 2F. The composite resistor 1091 further includes a lower sheet layer 1095 disposed on the higher sheet layer 1092 in the composite body region 1097 and the composite head regions 1094, and extending onto the intermediate dielectric layer 1020 around the lateral boundary of the higher sheet layer 1092. A hard mask 1026 may be disposed over the lower sheet layer 1095, over the lower sheet layer of the lower sheet resistor and over the upper head layers of the higher sheet resistor. The ILD layer 1034 is disposed over the composite resistor 1091. Vias 1036 are disposed through the ILD layer 1034 and the hard mask 1026 if present to provide electrical connections to the lower sheet layer 1095 in the composite head regions 1094, to the upper head layers of the higher sheet resistor and to the head regions of the lower sheet resistor.

Referring to FIG. 10B, which is a top view of the integrated circuit 1000, the composite resistor 1091 in the instant example has a rectangular configuration, with the composite head regions 1094 at ends of the composite resistor 1091 and the composite body region 1097 between the composite head regions 1094. Other configurations of the composite resistor 1091 are within the scope of the instant example. The composite body region 1097 is exposed for a laser trimming operation. The composite resistor 1091 advantageously provides a resistor having values of characteristics such as TCR between values of the characteristics of the higher sheet resistor and the lower sheet resistor of the integrated circuit 1000. The composite body region 1097 has a sheet resistance lower than a sheet resistance of the lower sheet layer of the lower sheet resistor. The higher sheet resistor, the lower sheet resistor and the composite resistor 1091 are all advantageously laser-trimmable using a same laser setup, as a result of being located over the lower dielectric layer 1002 and below the ILD layer 1034 of FIG. 10A; the ILD layer 1034 is not shown in FIG. 10B to more clearly show the structure of the composite resistor 1091. The composite resistor 1091 is advantageously formed concurrently with the higher sheet resistor and the lower sheet resistor, and does not add fabrication cost or complexity to the process of forming the integrated circuit 1000.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a lower dielectric layer;
a higher sheet resistance resistor disposed above the lower dielectric layer, the higher sheet resistance resistor comprising:
  a higher sheet resistance layer which is laser-trimmable; and
  upper head layers disposed on head regions of the higher sheet resistance layer, a body region of the higher sheet resistance layer being located between the head regions of the higher sheet resistance layer; and
a lower sheet resistance resistor disposed above the lower dielectric layer, the lower sheet resistance resistor comprising a lower sheet resistance layer which is laser-trimmable, thicker than the higher sheet resistance layer, and having a sheet resistance lower than a sheet resistance of the higher sheet resistance layer;
wherein:
  the higher sheet resistance layer and the lower sheet resistance layer are disposed in a same level of dielectric layers of the integrated circuit;
  the upper head layers and the lower sheet resistance layer have a same composition and thickness;
  the lower sheet resistance resistor is free of head layers over the lower sheet resistance layer; and
  the higher sheet resistance resistor is free of additional head layers over the upper head layers.

2. The integrated circuit of claim 1, wherein:
the higher sheet resistance layer is 1 nanometer to 30 nanometers thick, and has a sheet resistance greater than 200 ohms/square; and
the lower sheet resistance layer is 20 nanometers to 300 nanometers thick, and has a sheet resistance of 10 ohms/square to 200 ohms/square.

3. The integrated circuit of claim 1, comprising an intermediate dielectric layer disposed over the higher sheet resistance layer and under the lower sheet resistance layer, wherein the upper head layers extend through intermediate via holes through the intermediate dielectric layer over the head regions of the higher sheet resistance layer to contact the higher sheet resistance layer.

4. The integrated circuit of claim 3, comprising a protective dielectric layer disposed over, and coterminous with, the higher sheet resistance layer, wherein the intermediate via holes extend through the protective dielectric layer.

5. The integrated circuit of claim 1, comprising:
an inter-level dielectric (ILD) layer disposed over the higher sheet resistance resistor and the lower sheet resistance resistor; and
vias extending through the ILD layer, wherein a first via of the vias contacts the lower sheet resistance layer a head region of the lower sheet resistance layer and a second via of the vias contacts one of the upper head layers of the higher sheet resistance resistor.

6. The integrated circuit of claim 3, comprising:
a plurality of the intermediate via holes located over a first head region of the head regions of the higher sheet resistance layer; and
a plurality of vias making contact with the upper head layer over the first head region in each of the intermediate via holes, one via per intermediate via hole, wherein the vias making contact with the upper head layer over the first head region have substantially equidimensional lateral cross sections.

7. The integrated circuit of claim 3, wherein one of the intermediate via holes has a width of at least half a width of the higher sheet resistance layer and is located over a first head region of the head regions of the higher sheet resistance layer, and comprising a plurality of vias making contact with the upper head layer over the first head region in the intermediate via hole having the width of at least half the width of the higher sheet resistance layer, wherein the vias making contact with the upper head layer over the first head region have substantially equidimensional lateral cross sections.

8. The integrated circuit of claim 3, wherein one of the intermediate via holes has a width of at least half a width of the higher sheet resistance layer and is located over a first head region of the head regions of the higher sheet resistance layer, and comprising a single via making contact with the upper head layer over the first head region in the intermediate via hole having the width of at least half the width of the higher sheet resistance layer, wherein the single via has a rectangular lateral cross section.

9. The integrated circuit of claim 1, wherein the higher sheet resistance layer comprises carbon-doped silicon chromium, and the lower sheet resistance layer comprises carbon-doped silicon chromium.

10. The integrated circuit of claim 1, wherein head regions of the lower sheet resistance layer are disposed in intermediate via holes though an intermediate dielectric layer, the lower sheet resistance layer further comprising lower head pads disposed under the intermediate via holes and over the lower dielectric layer, wherein the lower sheet resistance layer contacts the lower head pads, and wherein the lower head pads have a same composition and thickness as the higher sheet resistance layer.

11. The integrated circuit of claim 1, further comprising lower head pads disposed under an intermediate dielectric layer and over the lower dielectric layer, wherein the lower sheet resistance layer is disposed over the intermediate dielectric layer, the lower head pads being disposed under head regions of the lower sheet resistance layer and separated from the lower sheet resistance layer by the intermediate dielectric layer, and wherein the lower head pads have a same composition and thickness as the higher sheet resistance layer.

12. The integrated circuit of claim 1, wherein the higher sheet resistance layer is a first higher sheet resistance layer, and the lower sheet resistance layer is a first lower sheet resistance layer, and further comprising a composite resistor comprising a second higher sheet resistance layer having a same thickness and composition as the first higher sheet resistance layer, and comprising a second lower sheet resistance layer having a same thickness and composition as the first lower sheet resistance layer, the second higher sheet resistance layer and the second lower sheet resistance layer being connected at composite head regions of the composite resistor and separated at body regions of the second higher sheet resistance layer and the second lower sheet resistance layer.

* * * * *